United States Patent
Wang et al.

(10) Patent No.: US 12,376,433 B2
(45) Date of Patent: Jul. 29, 2025

(54) DISPLAY DEVICE

(71) Applicant: Samsung Display Co., LTD., Yongin-si (KR)

(72) Inventors: Jeong Kook Wang, Hwaseong-si (KR); Ki Nyeng Kang, Sejong-si (KR); In Pyo Kim, Asan-si (KR); Jae Hee Kim, Sejong-si (KR); Hong Joon Moon, Cheonan-si (KR); Jong Hwan Cha, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 518 days.

(21) Appl. No.: 17/896,462

(22) Filed: Aug. 26, 2022

(65) Prior Publication Data

US 2023/0155064 A1    May 18, 2023

(30) Foreign Application Priority Data

Nov. 18, 2021 (KR) .................. 10-2021-0159530

(51) Int. Cl.
*H10H 20/83* (2025.01)
*H10H 20/831* (2025.01)
(Continued)

(52) U.S. Cl.
CPC ...... *H10H 20/8312* (2025.01); *H10H 20/833* (2025.01); *H10H 20/857* (2025.01); *H10H 29/142* (2025.01)

(58) Field of Classification Search
None
See application file for complete search history.

(56) References Cited

U.S. PATENT DOCUMENTS 7,615,792 B2 * 11/2009 Yokoyama ....... H10K 59/80524
257/E33.064
10,454,070 B2 * 10/2019 Sakamoto ............ H10K 50/171
(Continued)

FOREIGN PATENT DOCUMENTS

KR    10-2019-0124359    11/2019
KR    10-2057821         12/2019
(Continued)

OTHER PUBLICATIONS

PCT International Search Report in Corresponding PCT International Application No. PCT/KR2022/017421 Dated Feb. 23, 2023.
(Continued)

*Primary Examiner* — Bilkis Jahan
(74) *Attorney, Agent, or Firm* — KILE PARK REED & HOUTTEMAN PLLC

(57) ABSTRACT

A display device includes light-emitting elements disposed on first and second electrodes, and having first end portions disposed on the first electrode, and second end portions disposed on the second electrode, a first connecting electrode extending in a first direction and disposed on the first electrode, the first connecting electrode being in contact with the first end portions of the light-emitting elements, a second connecting electrode extending in the first direction and disposed on the second electrode, the second connecting electrode being in contact with the second end portions of the light-emitting elements, and a connecting electrode pattern disposed on the first electrode, the connecting electrode pattern overlapping the first connecting electrode. The second connecting electrode and the connecting electrode pattern include a same material, and a thickness of the first connecting electrode is less than a thickness of the second connecting electrode and the connecting electrode pattern.

20 Claims, 24 Drawing Sheets

(51) Int. Cl.
*H10H 20/833* (2025.01)
*H10H 20/857* (2025.01)
*H10H 29/14* (2025.01)

(56) References Cited

U.S. PATENT DOCUMENTS

| | | | |
|---|---|---|---|
| 11,088,126 B2* | 8/2021 | Heo | H10D 86/0231 |
| 2014/0361261 A1* | 12/2014 | Choi | H10K 59/12 |
| | | | 438/23 |
| 2020/0144453 A1* | 5/2020 | Chang | H10H 20/8514 |
| 2021/0202452 A1* | 7/2021 | Kim | H10H 20/857 |
| 2021/0242380 A1 | 8/2021 | Kim et al. | |
| 2022/0181522 A1 | 6/2022 | Moon et al. | |
| 2022/0293835 A1 | 9/2022 | Li et al. | |
| 2022/0328742 A1 | 10/2022 | Kim et al. | |
| 2023/0016834 A1 | 1/2023 | Jeong et al. | |

FOREIGN PATENT DOCUMENTS

| | | |
|---|---|---|
| KR | 10-2020-0088954 | 7/2020 |
| KR | 10-2020-0121956 | 10/2020 |
| KR | 10-2020-0145965 | 12/2020 |
| KR | 10-2021-0008252 | 1/2021 |
| KR | 10-2021-0086805 | 7/2021 |
| KR | 10-2021-0132259 | 11/2021 |
| KR | 10-2023-0014038 | 1/2023 |

OTHER PUBLICATIONS

PCT Written Opinion in Corresponding PCT International Application No. PCT/KR2022/017421, Dated Feb. 23, 2023.

* cited by examiner

RME: RME1, RME2
CNE4: CN_E1, CN_B1, CN_B2, CN_B3, CN_C1

DISPLAY DEVICE

CROSS-REFERENCE TO RELATED APPLICATION(S)

This application claims priority to and benefits of Korean Patent Application No. 10-2021-0159530 under 35 U.S.C. § 119, filed on Nov. 18, 2021 in the Korean Intellectual Property Office (KIPO), the entire contents of which are incorporated herein by reference.

BACKGROUND

1. Technical Field

The disclosure relates to a display device.

2. Description of the Related Art

With the advancement of multimedia, importance of a display device has been enhanced. Accordingly, various types of display devices such as organic light emitting display (OLED) devices and liquid crystal display (LCD) devices have been used.

There is a self-light emitting display device including a light emitting element as a device displaying an image of the display device. The self-light emitting display device may be a light emitting element, and may include an organic light emitting display device using an organic material as a light emitting material, an inorganic light emitting display device using an inorganic material as a light emitting material, or the like.

SUMMARY

Aspects of the disclosure provide a display device capable of preventing connection defects between electrodes from different layers.

However, aspects of the disclosure are not restricted. The above and other aspects of the disclosure will become more apparent to one of ordinary skill in the art to which the disclosure pertains by referencing the detailed description of the disclosure given below.

According to an embodiment of the disclosure, a display device may include a first electrode extending in a first direction, a second electrode spaced apart from the first electrode in a second direction, the second electrode extending in the first direction, light-emitting elements disposed on the first and second electrodes, the light-emitting elements having first end portions disposed on the first electrode, and second end portions disposed on the second electrode, a first connecting electrode extending in the first direction and disposed on the first electrode, the first connecting electrode being in electrical contact with the first end portions of the light-emitting elements, a second connecting electrode extending in the first direction and disposed on the second electrode, the second connecting electrode being in electrical contact with the second end portions of the light-emitting elements, and a connecting electrode pattern disposed on the first electrode, the connecting electrode pattern overlapping the first connecting electrode in a plan view. The second connecting electrode and the connecting electrode pattern may include a same material, and a thickness of the first connecting electrode may be less than a thickness of the second connecting electrode and a thickness of the connecting electrode pattern.

In an embodiment, the first connecting electrode may include at least one of indium tin oxide, indium zinc oxide, indium gallium oxide, indium zinc tin oxide, indium gallium tin oxide, indium gallium zinc oxide, and indium gallium zinc tin oxide, and each of the second connecting electrode and the connecting electrode pattern may include at least one of silver, copper, aluminum, nickel, lanthanum, titanium, molybdenum, niobium, and an alloy thereof.

In an embodiment, the thickness of the first connecting electrode may be in a range of about 500 Å to about 1000 Å, and the thickness of the second connecting electrode and the thickness of the connecting electrode pattern may be in a range of about 1000 Å to about 3000 Å.

In an embodiment, each of the light-emitting elements may include a first semiconductor layer, a second semiconductor layer, and a light-emitting layer disposed between the first and second semiconductor layers, the second semiconductor layers of the light-emitting elements may be disposed in the first end portions of the light-emitting elements, and the first semiconductor layers of the light-emitting elements may be disposed in the second end portions of the light-emitting elements and may be in electrical contact with the second connecting electrode.

In an embodiment, the display device may further include a first insulating layer disposed on the first and second electrodes, a second insulating layer disposed on the light-emitting elements, on the first insulating layer, and a third insulating layer disposed on the second insulating layer, the second connecting electrode, and the connecting electrode pattern. The light-emitting elements may be disposed directly on the first insulating layer, and a portion of the first connecting electrode may be disposed directly on the third insulating layer.

In an embodiment, the connecting electrode pattern may be in direct contact with the first electrode through a first contact hole which penetrates the first and second insulating layers, the second connecting electrode may be in direct contact with the second electrode through a second contact hole which penetrates the first and second insulating layers, and the first connecting electrode may be in direct contact with the connecting electrode pattern through a third contact hole which penetrates the third insulating layer.

In an embodiment, the display device may further include a bank layer disposed on the first insulating layer, the bank layer surrounding an emission area where the light-emitting elements may be disposed and a subarea which may be disposed on a side of the emission area The first and second electrodes may be disposed in and across the emission area and the subarea, and the connecting electrode pattern may be disposed in the subarea.

In an embodiment, the display device may further include another second electrode, the second electrode and the another second electrode being spaced apart from the first electrode with the first electrode disposed between the second electrode and the another second electrode, wherein the light-emitting elements may include first light-emitting elements which have first end portions disposed on the first electrode and second end portions disposed on the second electrode, and second light-emitting elements which have first end portions disposed on the first electrode and second end portions disposed on the another second electrode.

In an embodiment, the first connecting electrode may be disposed on the first electrode and may be in electrical contact with the first end portions of the first light-emitting elements, and the second connecting electrode may be disposed on the another second electrode where the second end portions of the second light-emitting elements may be disposed, and may be in electrical contact with the second end portions of the second light-emitting elements.

In an embodiment, the display device may further include a third connecting electrode spaced apart from the first connecting electrode and disposed on the first electrode, the third connecting electrode being in electrical contact with the first end portions of the second light-emitting elements, and a fourth connecting electrode in electrical contact with the second end portions of the second light-emitting elements and the third connecting electrode. The fourth connecting electrode may include a first extension portion which may be disposed on the second electrode where the second end portions of the second light-emitting elements may be disposed, a first connecting portion which may be in electrical contact with the third connecting electrode, and a first bypass portion which may be connected to the first extension portion and the first connecting portion and bypasses the first connecting electrode.

According to an embodiment of the disclosure, a display device may include a first electrode extending in a first direction, a second electrode spaced apart from the first electrode in a second direction, the second electrode extending in the first direction, light-emitting elements disposed on the first and second electrodes, the light-emitting elements having first end portions disposed on the first electrode and second end portions disposed on the second electrode, a first connecting electrode extending in the first direction and disposed on the first electrode, a second connecting electrode extending in the first direction and disposed on the second electrode, a third connecting electrode spaced apart from the first connecting electrode in the first direction and disposed on the first electrode, the third connecting electrode facing the second connecting electrode in the second direction, a fourth connecting electrode including a first extension portion which faces the first connecting electrode in the second direction, and a connecting electrode pattern disposed on the first electrode, the connecting electrode pattern overlapping the first connecting electrode in a plan view. The fourth connecting electrode may further include a first connecting portion which may be disposed on the first electrode and may be in electrical contact with the third connecting electrode, and one or more bypass portions, which may be electrically connected to the first extension portion and the first connecting portion and bypass the first connecting electrode.

In an embodiment, the first and third connecting electrodes may include at least one of indium tin oxide, indium zinc oxide, indium gallium oxide, indium zinc tin oxide, indium gallium tin oxide, indium gallium zinc oxide, and indium gallium zinc tin oxide, the second and fourth connecting electrodes and the connecting electrode pattern may include at least one of silver, copper, aluminum, nickel, lanthanum, titanium, molybdenum, niobium, and an alloy thereof, and a thickness of the first and third connecting electrodes may be less than a thickness of the second and fourth connecting electrodes and a thickness of the connecting electrode pattern.

In an embodiment, the first extension portion of the fourth connecting electrode may be spaced apart from the second connecting electrode in the first direction and may be disposed on the second electrode, and the light-emitting elements may include first light-emitting elements which have first end portions in electrical contact with the first connecting electrode and second end portions in electrical contact with the first extension portion of the fourth connecting electrode, and second light-emitting elements which have first end portions in electrical contact with the third connecting electrode and second end portions in electrical contact with the second connecting electrode.

In an embodiment, the display device may further include a first insulating layer disposed on the first and second electrodes, and a bank layer disposed on the first insulating layer, the bank layer surrounding an emission area where the light-emitting elements may be disposed and a subarea which may be disposed on one side of the emission area. The one or more bypass portions of the fourth connecting electrode may include a first bypass portion which extends in the second direction in the subarea, a second bypass portion which may be electrically connected to the first bypass portion and extends in the first direction on the bank layer, and a third bypass portion which may be electrically connected to the second bypass portion and the first connecting portion and extends in the second direction and may be spaced apart from the second connecting electrode.

In an embodiment, the display device may further include a second insulating layer disposed on the light-emitting elements, on the first insulating layer, and a third insulating layer disposed on the second insulating layer, the second and fourth connecting electrodes, and the connecting electrode pattern. The light-emitting elements may be disposed directly on the first insulating layer, and portions of the first and third connecting electrodes may be disposed directly on the third insulating layer.

In an embodiment, the connecting electrode pattern may be in direct contact with the first electrode through a first contact hole which penetrates the first and second insulating layers, the second connecting electrode may be in direct contact with the second electrode through a second contact hole which penetrates the first and second insulating layers, the first connecting electrode may be in direct contact with the connecting electrode pattern through a third contact hole which penetrates the third insulating layer, and the third connecting electrode may be in direct contact with the fourth connecting electrode through a fourth contact hole which penetrates the third insulating layer, in the emission area.

In an embodiment, the display device may further include a third electrode extending in the first direction between the first and second electrodes, and a fourth electrode spaced apart from the third electrode in the second direction with the second electrode interposed therebetween. The first extension portion of the fourth connecting electrode may be disposed between the first and second connecting electrodes and on the third electrode, and the light-emitting elements may include first light-emitting elements which have first end portions disposed on the first electrode and in electrical contact with the second connecting electrode, second light-emitting elements which may include second end portions disposed on the second electrode and in electrical contact with the second connecting electrode, third light-emitting elements which have first end portions disposed on the first electrode and in electrical contact with the third connecting electrode, and fourth light-emitting elements which have first end portions disposed on the fourth electrode and second end portions disposed on the second electrode.

In an embodiment, the display device may further include a fifth connecting electrode including a second extension portion which may be disposed on the third electrode and electrically contacting second end portions of the third light-emitting elements, a sixth connecting electrode disposed on the fourth electrode and electrically contacting the first end portions of the fourth light-emitting elements, a seventh connecting electrode including a third extension portion which may be disposed on the second electrode and electrically contacting the second end portions of the fourth light-emitting elements, and an eighth connecting electrode disposed on the fourth electrode and electrically contacting first end portions of the second light-emitting elements.

In an embodiment, the sixth and eighth connecting electrodes and the first connecting electrode may include a same material, and the fifth and seventh connecting electrodes and the second connecting electrode may include a same material.

In an embodiment, the fifth connecting electrode may further include a fourth bypass portion which may be electrically connected to the second extension portion and extends in the second direction on the bank layer, and a second connecting portion which extends in the first direction from the fourth bypass portion and electrically contacting the sixth connecting electrode, and the seventh connecting electrode may further include a fifth bypass portion which may be electrically connected to the third extension portion and extends in the second direction between the second light-emitting elements and the fourth light-emitting elements, and a third connecting portion which extends in the first direction from the fifth bypass portion and may be electrically connected to the eighth connecting electrode.

According to the aforementioned and other embodiments of the disclosure, as connecting electrodes having different thicknesses may be provided, disconnection defects can be prevented in connecting electrodes having a relatively small thickness.

Also, as connecting electrodes may be disposed in consideration of the alignment direction of light-emitting elements, any disconnection defects can be prevented in the connecting electrodes while maintaining the emission efficiency of the light-emitting elements.

It should be noted that the effects of the disclosure are not limited to those described above, and other effects of the disclosure will be apparent from the following description.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
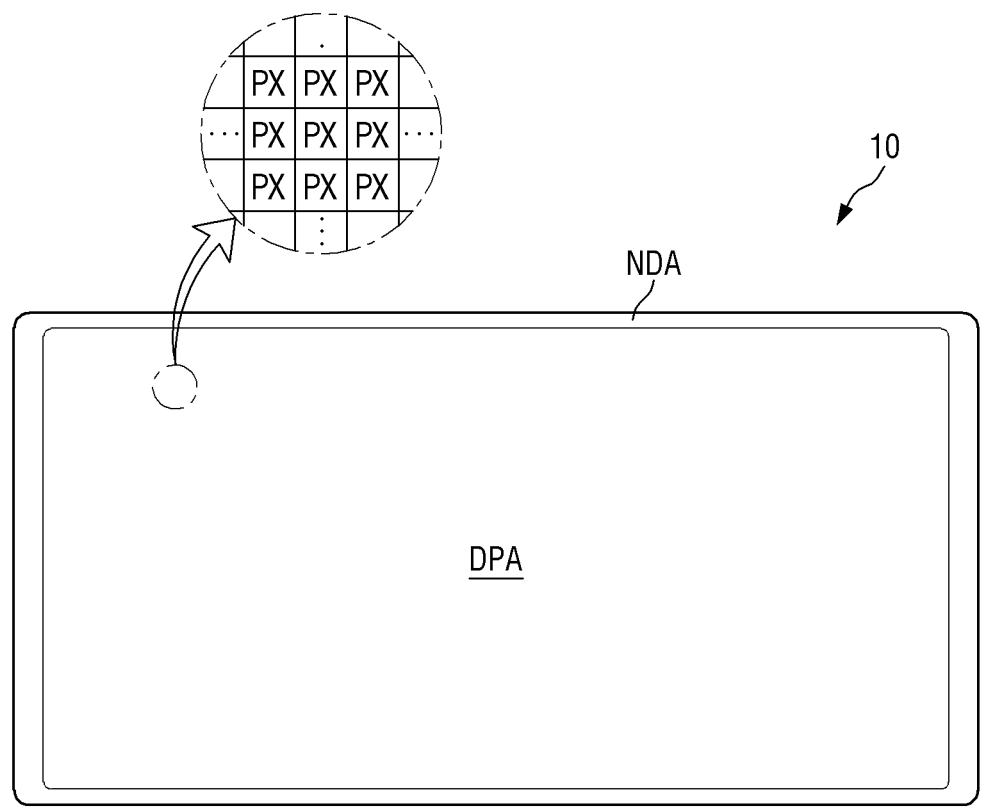
FIG. 1 is a schematic plan view of a display device according to an embodiment of the disclosure.

The disclosure will now be described more fully hereinafter with reference to the accompanying drawings, in which embodiments of the disclosure are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

As used herein, the singular forms, "a," "an," and "the" are intended to include the plural forms as well, unless the context clearly indicates otherwise.

It will also be understood that when a layer is referred to as being "on" another layer or substrate, it can be directly on another layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

When an element is described as "not overlapping" or to "not overlap" another element, this may include that the elements are spaced apart from each other, offset from each other, or set aside from each other or any other suitable term as would be appreciated and understood by those of ordinary skill in the art.

It will be understood that the terms "connected to" or "coupled to" may include a physical or electrical connection or coupling.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

When an element is referred to as being "in contact" or "contacted" or the like to another element, the element may be in "electrical contact" or in "physical contact" with another element; or in "indirect contact" or in "direct contact" with another element.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic plan view of a display device according to an embodiment of the disclosure.

Referring to FIG. 1, a display device 10 may display a moving or still image. The term display device 10 may refer to nearly all types of electronic devices that provide a display screen. Examples of the display device 10 may include a television (TV), a notebook computer, a monitor, a billboard, an Internet-of-Things (IoT) device, a mobile phone, a smartphone, a tablet personal computer (PC), an electronic watch, a smartwatch, a watchphone, a head-mounted display (HMD), a mobile communication terminal, an electronic notepad, an electronic book (e-book), a portable multimedia player (PMP), a navigation device, a gaming console, a digital camera, a camcorder, and the like.

The display device 10 may include a display panel that provides a display screen. Examples of the display panel of the display device 10 may include an inorganic light-emitting diode (LED) display panel, an organic light-emitting diode (OLED) display panel, a quantum-dot light-emitting diode (QLED) display panel, a plasma display panel (PDP), a field-emission display (FED) panel, and the like. The display panel of the display device 10 will hereinafter be described as being, for example, an ILED display panel, but the disclosure is not limited thereto. For example, various other display panels are also applicable to the display panel of the display device 10.

The shape of the display device 10 may vary. For example, the display device 10 may have a rectangular shape that extends longer in a horizontal direction than in a vertical direction, a rectangular shape that extends longer in the vertical direction than in the horizontal direction, a square shape, a tetragonal shape with rounded corners, a non-tetragonal polygonal shape, or a circular shape. The shape of a display area DPA of the display device 10 may be similar to the shape of the display device 10. FIG. 1 illustrates that the display device 10 and the display area DPA both have a rectangular shape that extends in a second direction DR2.

The display device 10 may include the display area DPA and a non-display area NDA. The display area DPA may be an area in which a screen may be displayed, and the non-display area NDA may be an area in which a screen may not be displayed. The display area DPA may also be referred to as an active area, and the non-display area NDA may also be referred to as an inactive area. The display area DPA may occupy the middle portion of the display device 10.

The display area DPA may include pixels PX. The pixels PX may be arranged in row and column directions. Each of the pixels PX may have a rectangular or square shape in a plan view, but the disclosure is not limited thereto. In other embodiments, each of the pixels PX may have a rhombus shape having sides inclined with respect to a particular direction. The pixels PX may be arranged in a stripe fashion or an island fashion. Each of the pixels PX may include one or more light-emitting elements, which emit light of a particular wavelength range.

The non-display area NDA may be disposed around the display area DPA. The non-display area NDA may surround the entire display area DPA or a portion of the display area DPA. The display area DPA may have a rectangular shape, and the non-display area NDA may be disposed adjacent to four sides of the display area DPA. The non-display area NDA may form the bezel of the display device 10. Lines or circuit drivers included in the display device 10 may be disposed in the non-display area NDA, or external devices may be mounted in the non-display area NDA.

Figure 2:
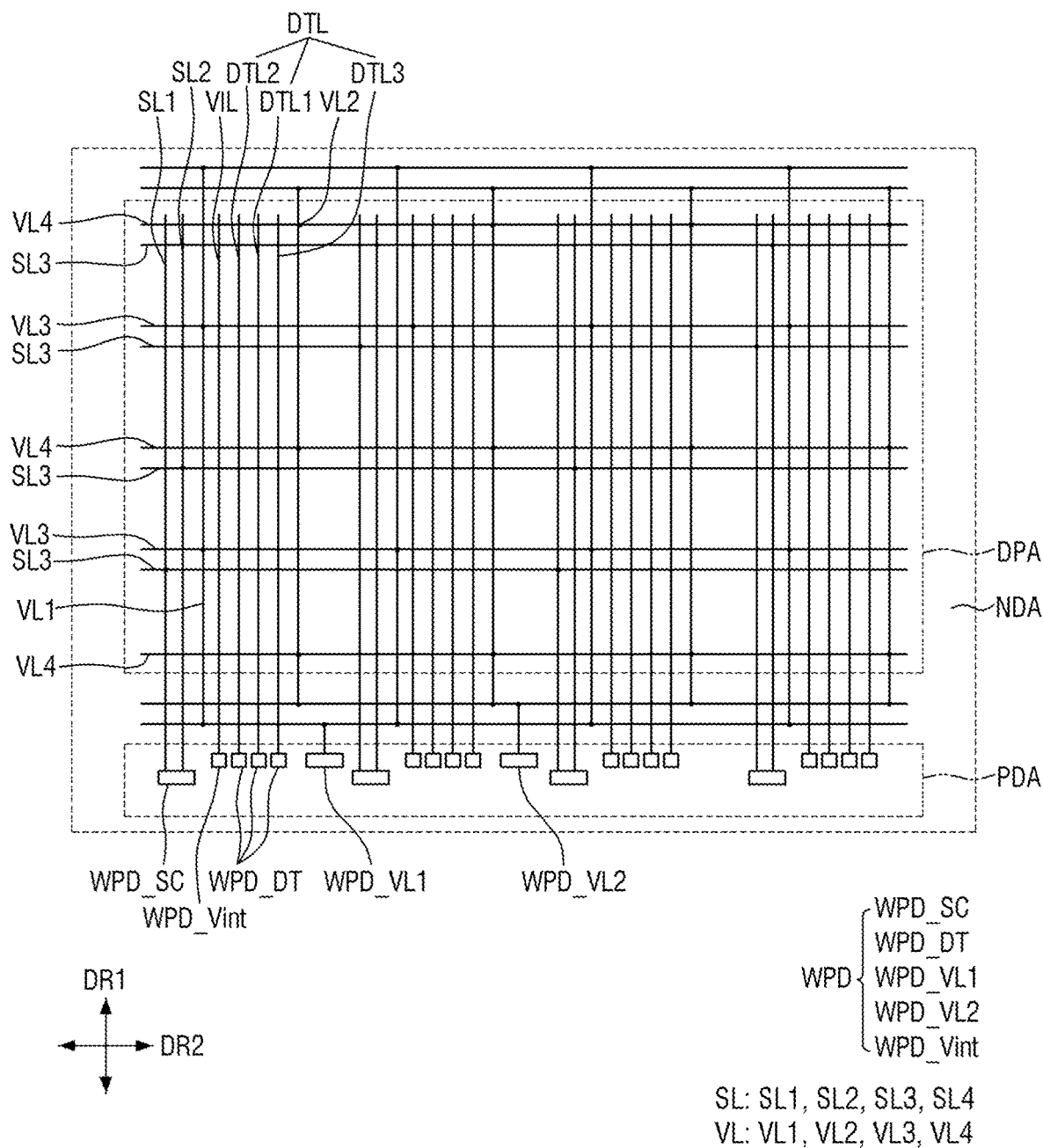
FIG. 2 is a schematic plan view illustrating the layout of lines included in the display device of FIG. 1.

FIG. 2 is a schematic plan view illustrating the layout of lines included in the display device of FIG. 1.

Referring to FIG. 2, the display device 10 may include lines. The display device 10 may include scan lines SL, data lines DTL, initialization voltage lines VIL, and voltage lines VL. Although not specifically illustrated, the display device 10 may further include other lines.

First scan lines SL1 and second scan lines SL2 may extend in the first direction DR1. A set of first and second scan lines SL1 and SL2 may be disposed adjacent to each other and may be spaced apart from other sets of first and second scan lines SL1 and SL2 in the second direction DR2. The first scan lines SL1 and the second scan lines SL2 may be connected to scan line pads WPD_SC, which may be connected to a scan driver (not illustrated). The first scan lines SL1 and the second scan lines SL2 may extend from a pad area PDA in the non-display area NDA to the display area DPA.

Third scan lines SL3 may extend in the second direction DR2 and may be spaced apart from one another in the first direction DR1. Each of the third scan lines SL3 may be connected to one or more first scan lines SL1 or one or more second scan lines SL2. The first scan lines SL1 and the second scan lines SL2 may be formed of a different conductive layer from the third scan lines SL3. The scan lines SL may form a mesh structure over the entire display area DPA, but the disclosure is not limited thereto.

The term "connect" or "connection", as used herein, not only may mean that one element may be coupled to another element through physical contact, but may mean that one element may be coupled to another element via yet another element. One integral member may be understood as having parts connected to one another. Also, the connection between two elements may encompass not only a direct connection between the two elements, but also an electrical connection between the two elements.

The data lines DTL may extend in the first direction DR1. The data lines DTL may include first data lines DTL1, second data lines DTL2, and third data lines DTL3. A first data line DTL1, a second data line DTL2, and a third data line DTL3 may be paired together to be disposed adjacent to one another. The data lines DTL may extend from the pad area PDA in the non-display area NDA to the display area DPA. However, the disclosure is not limited to this configuration. In other embodiments, the data lines DTL may be arranged at equal intervals between first voltage lines VL1 and second voltage lines VL2.

The initialization voltage lines VIL may extend in the first direction DR1. The initialization voltage lines VIL may be disposed between the data lines DTL, the first scan lines SL1, and the second scan lines SL2. The initialization voltage lines VIL may extend from the pad area PDA in the non-display area NDA to the display area DPA.

The first voltage lines VL1 and the second voltage lines VL2 may extend in the first direction DR1, and third voltage lines VL3 and fourth voltage lines VL4 may extend in the second direction DR2. The first voltage lines VL1 and the second voltage lines VL2 may be alternately arranged in the second direction DR2, and the third voltage lines VL3 and the fourth voltage lines VL4 may be alternately arranged in the first direction DR1. The first voltage lines VL1 and the second voltage lines VL2 may extend in the first direction DR1 across the display area DPA. Some of the third voltage lines VL3 and some of the fourth voltage lines VL4 may be disposed in the display area DPA, and other third voltage lines VL3 and other fourth voltage lines VL4 may be disposed in the non-display area NDA, on both sides, in the first direction DR1, of the display area DPA. The first voltage lines VL1 and the second voltage lines VL2 may be formed of a different conductive layer from the third voltage lines VL3 and the fourth voltage lines VL4. Each of the first voltage lines VL1 may be connected to one or more third voltage lines VL3, and each of the second voltage lines VL2 may be connected to one or more fourth voltage lines VL4. The voltage lines VL may form a mesh structure over the entire display area DPA, but the disclosure is not limited thereto.

Each of the first scan lines SL1, the second scan lines SL2, the data lines DTL, the initialization voltage lines VIL, the first voltage lines VL1, and the second voltage lines VL2 may be electrically connected to one or more line pads WPD. The line pads WPD may be disposed in the non-display area NDA. The line pads WPD may also be disposed in the pad area PDA on a second side, in the first direction DR1, of the display area DPA, e.g., on the lower side of the display area DPA. The first scan lines SL1 and the second scan lines SL2 may be connected to the scan line pads WPD_SC, and the data lines DTL may be connected to different data line pads WPD_DT. The initialization voltage lines VIL may be connected to initialization line pads WPD_Vint, the first voltage lines VL1 may be connected to first voltage line pads WPD_VL1, and the second voltage lines VL2 may be connected to second voltage line pads WPD_VL2. External devices may be mounted on the line pads WPD. The external devices may be mounted on the line pads WPD via anisotropic conductive films or ultrasonic bonding. The line pads WPD are illustrated as being disposed in the pad area PDA on the lower side of the display area DPA, but the disclosure is not limited thereto. In other embodiments, some of the line pads WPD may be disposed on the upper side of the display area DPA or on the left or right side of the display area DPA.

A pixel PX or a subpixel SPXn (where n may be an integer of 1 to 3) of the display device 10 may include a pixel driving circuit. The pixel driving circuit may include transistors and capacitors. The numbers of transistors and capacitors included in the pixel driving circuit may vary. For example, the pixel driving circuit may have a "3T1C" structure including three transistors and one capacitor. The pixel driving circuit will hereinafter be described as having the "3T1C" structure, but the disclosure is not limited thereto. In other embodiments, various other structures such as a "2T1C", "7T1C", or "6T1C" structure may also be applicable to the pixel driving circuit.

Figure 3:
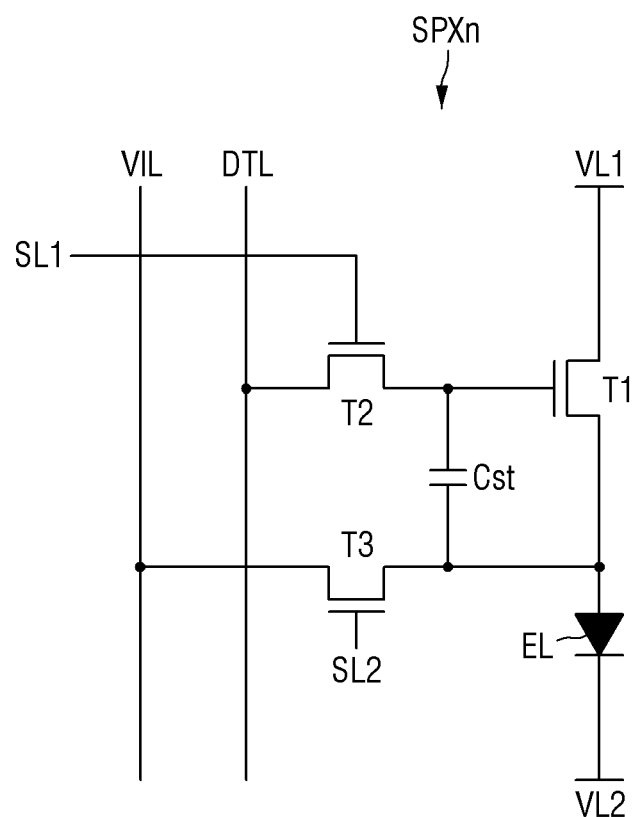
FIG. 3 is a schematic representation of a circuit of a subpixel of the display device of FIG. 1.

FIG. 3 is a schematic representation of a circuit of a subpixel of the display device of FIG. 1.

Referring to FIG. 3, a subpixel SPXn of the display device 10 may include a light-emitting diode (LED) "EL", three transistors, i.e., first through third transistors T1 through T3, and one storage capacitor Cst.

The LED "EL" may emit light in accordance with a current applied thereto via the first transistor T1. The LED "EL" may include a first electrode, a second electrode, and at least one light-emitting element disposed between the first and second electrodes. The light-emitting element may emit light of a particular wavelength range in accordance with electric signals transmitted thereto from the first and second electrodes.

A first end of the LED "EL" may be connected to the source electrode of the first transistor T1, and a second end of the LED "EL" may be connected to a second voltage line VL2, to which a low-potential voltage (hereinafter, a second power supply voltage) may be supplied. Here, the second power supply voltage may be lower than a high-potential voltage (hereinafter, a first power supply voltage), which may be supplied to a first voltage line VL1.

The first transistor T1 may control a current flowing from the first voltage line VL1, to which the first power supply voltage may be supplied, to the LED "EL" in accordance with the difference in voltage between the gate electrode and the source electrode of the first transistor T1. For example, the first transistor T1 may be a transistor for driving the LED "EL". The gate electrode of the first transistor T1 may be connected to the source electrode of the second transistor T2, the source electrode of the first transistor T1 may be connected to the first electrode of the LED "EL", and the drain electrode of the first transistor T1 may be connected to the first voltage line VL1, to which the first power supply voltage may be supplied.

The second transistor T2 may be turned on by a scan signal from a first scan line SL1 to connect a data line DTL to the gate electrode of the first transistor T1. The gate electrode of the second transistor T2 may be connected to the first scan line SL1, the source electrode of the second transistor T2 may be connected to the gate electrode of the first transistor T1, and the drain electrode of the second transistor T2 may be connected to the data line DTL.

The third transistor T3 may be turned on by a second scan signal from a second scan line SL2 to connect an initialization voltage line VIL to a first end of the LED "EL". The gate electrode of the third transistor T3 may be connected to the second scan line SL2, the drain electrode of the third transistor T3 may be connected to the initialization voltage line VIL, and the source electrode of the third transistor T3 may be connected to the first end of the LED "EL" or the source electrode of the first transistor T1.

The source electrodes and the drain electrodes of the first through third transistors T1 through T3 are not limited to the above descriptions. The first through third transistors T1 through T3 may be formed as thin-film transistors (TFTs). FIG. 3 illustrates that the first through third transistors T1 through T3 are formed as N-type metal-oxide semiconductor field-effect transistors (MOSFETs), but the disclosure is not limited thereto. In other embodiments, the first through third transistors T1 through T3 may all be formed as P-type MOSFETs. In yet other embodiments, some of the first through third transistors T1 through T3 may be formed as N-type MOSFETS, and other transistor(s) may be formed as P-type MOSFETs.

The storage capacitor Cst may be formed between the gate electrode and the source electrode of the first transistor T1. The storage capacitor Cst may store a differential voltage corresponding to the difference in voltage between the gate electrode and the source electrode of the first transistor T1.

The structure of a pixel PX of the display device 10 will hereinafter be described in further detail.

Figure 4:
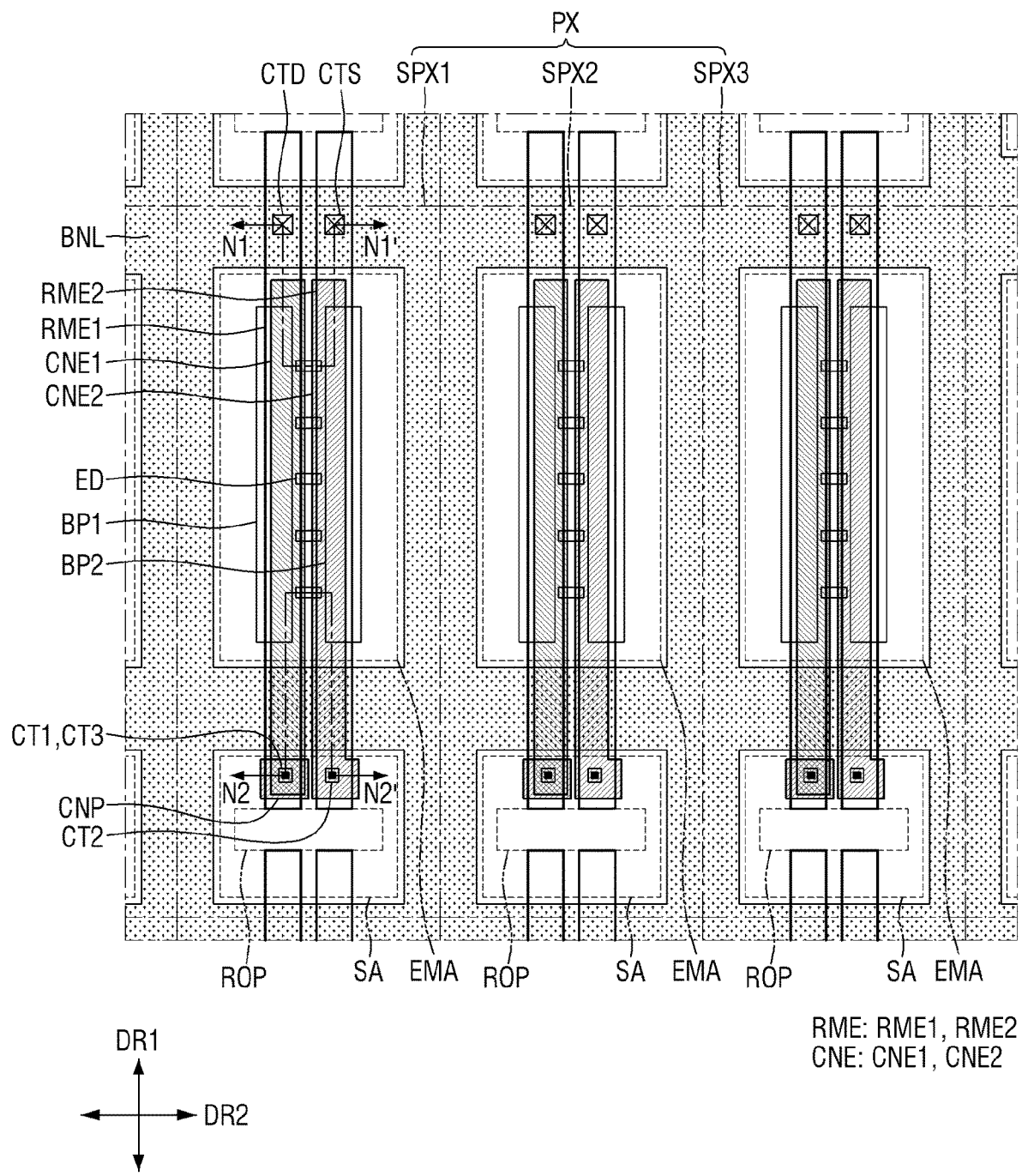
FIG. 4 is a schematic plan view of a pixel of the display device of FIG. 1.

FIG. 4 is a schematic plan view of a pixel of the display device of FIG. 1. FIG. 4 is a plan view illustrating the layout of electrodes RME, bank patterns (BP1 and BP2), a bank layer BNL, light-emitting elements ED, and connecting electrodes CNE in a pixel PX of the display device 10.

Referring to FIG. 4, a pixel PX may include subpixels SPXn. For example, the pixel PX may include first through third subpixels SPX1 through SPX3. The first subpixel SPX1 may emit first-color light, the second subpixel SPX2 may emit second-color light, and the third subpixel SPX3 may emit third-color light. For example, the first-color light, the second-color light, and the third-color light may be blue light, green light, and red light, respectively, but the disclosure is not limited thereto. In other embodiments, the subpixels SPXn may all emit light of the same color. For example, the subpixels SPXn may all emit blue light. FIG. 4 illustrates that the pixel PX may include three subpixels SPXn, but the disclosure is not limited thereto. In other embodiments, the pixel PX may include more than three subpixels SPXn.

Each of the subpixels SPXn may include an emission area EMA and a non-emission area. The emission area EMA may be an area that outputs light of a particular wavelength range due to the presence of light-emitting elements ED therein. The non-emission area may be an area that may not be reached by light emitted by the light-emitting elements ED and may not output light due to the absence of light-emitting elements therein.

The emission area EMA may include a region where arrays of light-emitting elements ED may be disposed and a region around the array of light-emitting elements ED that outputs light emitted by the light-emitting elements ED. For example, the emission area EMA may also include a region that outputs light emitted by the light-emitting elements ED and reflected or refracted by other members. Light-emitting elements ED may be disposed in each of the subpixels SPXn to form an emission area EMA including a region where the light-emitting elements ED may be disposed and the surroundings of the region where the light-emitting elements ED may be disposed.

FIG. 4 illustrates that the emission areas EMA of the first through third subpixels SPX1 through SPX3 have the same size. In some embodiments, the emission areas EMA of the subpixels SPXn may have different sizes depending on the color or the wavelength of light emitted by light-emitting elements ED.

Each of the subpixels SPXn may further include a subarea SA, which may be disposed in the non-emission area of the corresponding subpixel SPXn. The subarea SA may be disposed on the lower side of the emission area EMA. For example, in each of the subpixels SPXn, the emission area EMA and the subarea SA may be arranged one after another in the first direction DR1, and the subarea SA of each of the subpixels SPXn may be disposed between two emission areas EMA of two adjacent subpixels SPXn that may be spaced apart from each other in the first direction DR1. For example, emission areas EMA and subareas SA may be alternately arranged in the first direction DR1, and emission areas EMA or subareas SA may be repeatedly arranged in the second direction DR2. However, the disclosure is not limited to this example. For example, the emission areas EMA and the subareas SA of the subpixels SPXn may have a different layout from that illustrated in FIG. 4.

As no light-emitting elements ED may be disposed in the subarea SA of each of the subpixels SPXn, no light may be output from the subarea SA of each of the subpixels SPXn, but electrodes RME may be disposed in part in the subarea SA of each of the subpixels SPXn. The electrodes RME of each of the subpixels SPXn may be separated from electrodes RME from another subpixel SPXn by a separation part ROP of the subarea SA of the corresponding subpixel SPXn.

Lines (or wires) and circuit elements of a circuit layer disposed in the pixel PX to be connected to light-emitting elements ED may be connected to the first through third subpixels SPX1 through SPX3. However, the lines and the circuit elements may not be disposed to correspond to the first through third subpixels SPX1 through SPX3 or the emission areas EMA of the first through third subpixels SPX1 through SPX3, but may be disposed regardless of the locations of the emission areas EMA of the first through third subpixels SPX1 through SPX3 in the pixel PX.

The bank layer BNL may be disposed to surround the subpixels SPXn and the emission areas EMA and the subareas SA of the subpixels SPXn. The bank layer BNL may be disposed not only along the boundaries between subpixels SPXn that may be adjacent to one another in the first or second direction DR1 or DR2, but also along the boundaries between emission areas EMA, between subareas SA, and between the emission areas EMA and the subareas SA. The subpixels SPXn, the emission areas EMA, and the subareas SA of the display device 10 may be areas defined by the bank layer BNL. The distances between the subpixels SPXn, the emission areas EMA, and the subareas SA of the display device 10 may vary depending on the width of the bank layer BNL.

The bank layer BNL may include parts extending in the first direction DR1 and parts extending in the second direction DR2 and may be arranged in a lattice shape in a plan view, over the entire display area DPA. The bank layer BNL may be disposed along the boundaries of each of the subpixels SPXn to separate the subpixels SPXn from one another. The bank layer BNL may be disposed to surround and separate the emission areas EMA and the subareas SA of the subpixels SPXn.

Figure 5:
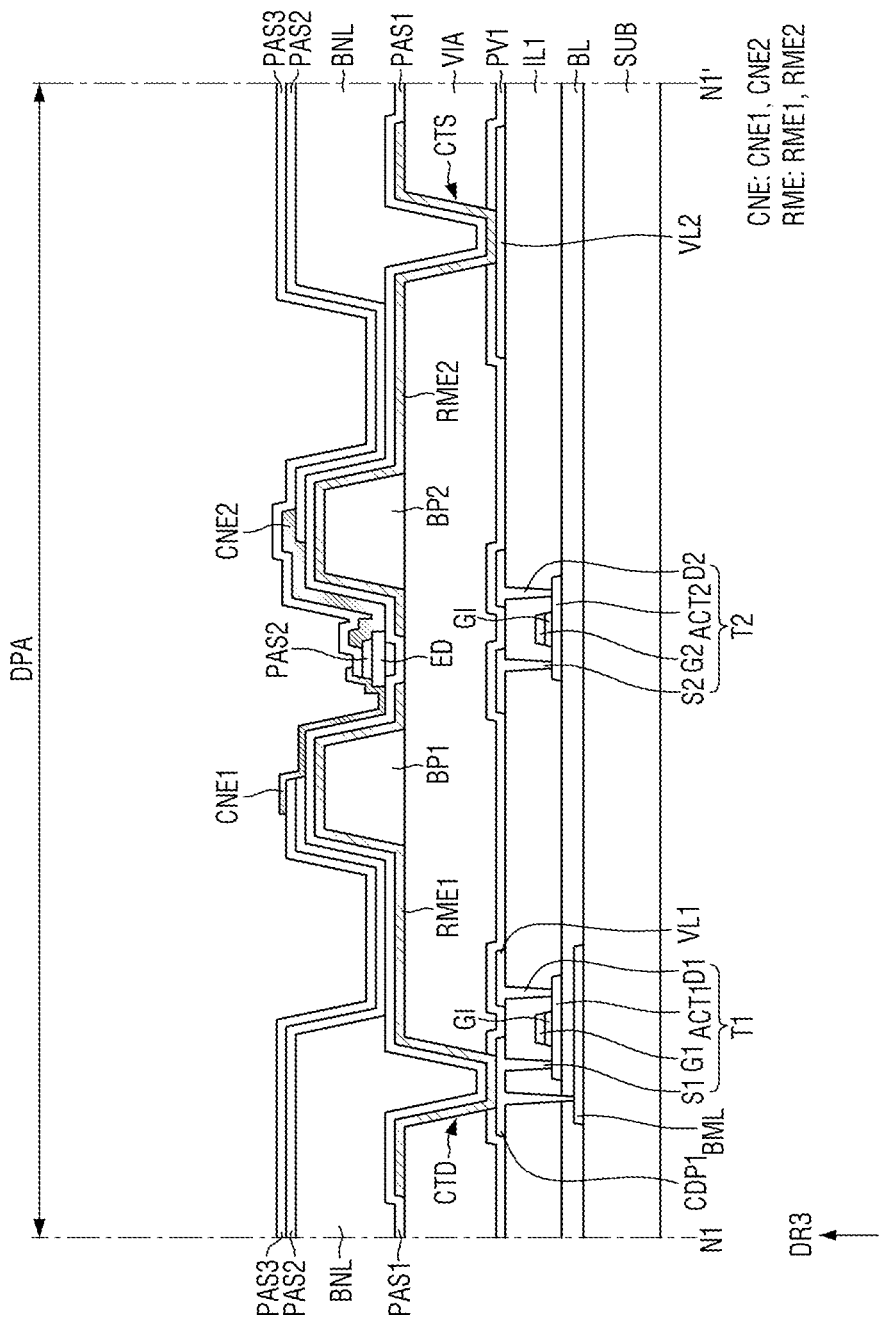
FIG. 5 is a schematic cross-sectional view taken along line N1-N1' of FIG. 4.
Figure 6:
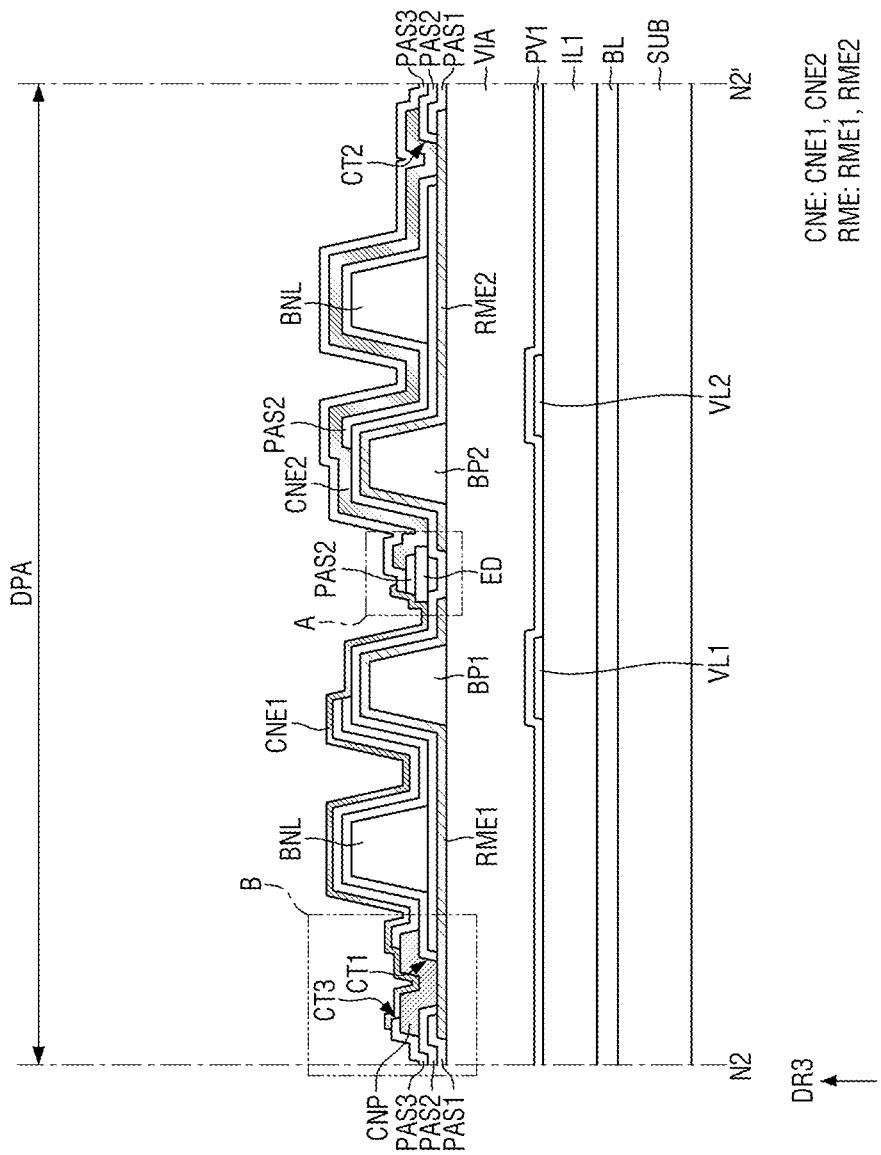
FIG. 6 is a schematic cross-sectional view taken along line N2-N2' of FIG. 4.

FIG. 5 is a schematic cross-sectional view taken along line N1-N1' of FIG. 4. FIG. 6 is a schematic cross-sectional view taken along line N2-N2' of FIG. 4. FIG. 5 illustrates a cross-sectional view taken across both end portions of a light-emitting element ED and electrode contact holes (CTD and CTS) in the first subpixel SPX1 of FIG. 4, and FIG. 6 illustrates a cross-sectional view taken across both end portions of a light-emitting element ED and first and second contact holes CT1 and CT2 of the first subpixel SPX1 of FIG. 4.

Referring to FIGS. 5 and 6 and further to FIG. 4, the display device 10 may include a first substrate SUB and a semiconductor layer, conductive layers, and insulating layers, which may be disposed on the first substrate SUB. The display device 10 may include, for example, in the first subpixel SPX1, electrodes RME, light-emitting elements ED, and connecting electrodes CNE. The semiconductor layer, the conductive layers, and the insulating layers may form a circuit layer of the display device 10.

The first substrate SUB may be an insulating substrate. The first substrate SUB may be formed of an insulating material such as glass, quartz, and/or a polymer resin. The first substrate SUB may be a rigid substrate or may be a flexible substrate that may be bendable, foldable, and/or rollable. The first substrate SUB may include a display area DPA and a non-display area NDA, which surrounds the display area DPA, and the display area DPA may include an emission area EMA and a subarea SA, which may be a portion of a non-emission area.

A first conductive layer may be disposed on the first substrate SUB. The first conductive layer may include a lower metal layer BML, and the lower metal layer BML may be disposed to overlap a first active layer ACT1 of a first transistor T1. The lower metal layer BML may prevent light from being incident upon the first active layer ACT1 of the first transistor T1 or may be electrically connected to the first active layer ACT1 to stabilize the electrical characteristics of the first transistor T1. The lower metal layer BML may not be provided.

A buffer layer BL may be disposed on the lower metal layer BML and the first substrate SUB. The buffer layer BL may be formed on the first substrate SUB to protect the transistors of the first subpixel SPX1 from moisture that may penetrate through the first substrate SUB, which may be vulnerable to moisture, and may perform a surface planarization function.

The semiconductor layer may be disposed on the buffer layer BL. The semiconductor layer may include the first active layer ACT1 of the first transistor T1 and a second active layer ACT2 of a second transistor T2. The first and second active layers ACT1 and ACT2 may be disposed to partially overlap first and second gate electrodes G1 and G2, respectively, of a second conductive layer that will be described later.

The semiconductor layer may include polycrystalline silicon, monocrystalline silicon, and/or an oxide semiconductor. In other embodiments, the semiconductor layer may include polycrystalline silicon. The oxide semiconductor may be an oxide semiconductor containing indium (In). For example, the oxide semiconductor may be at least one of indium tin oxide (ITO), indium zinc oxide (IZO), indium gallium oxide (IGO), indium zin tin oxide (IZTO), indium gallium tin oxide (IGTO), and indium gallium zinc tin oxide (IGZTO).

FIGS. 4 through 6 illustrate that the first subpixel SPX1 may include only one transistor, i.e., the first transistor T1, but the disclosure is not limited thereto. For example, the first subpixel SPX1 may include more than one transistor.

The first gate insulating layer GI may be disposed on the semiconductor layer, in the display area DPA. The first gate insulating layer GI may not be disposed in the pad area PDA. The first gate insulating layer GI may function as a gate insulating layer for first and second transistors T1 and T2 of the second conductive layer. FIGS. 5 and 6 illustrate that the first gate insulating layer GI may be patterned together with first and second gate electrodes G1 and G2 of the first and second transistors T1 and T2 to be placed in part between the first and second active layers ACT1 and ACT2 of the semiconductor layer, but the disclosure is not limited thereto. In other embodiments, the first gate insulating layer GI may be disposed on the entire buffer layer BL.

The second conductive layer may be disposed on the first gate insulating layer GI. The second conductive layer may include the first and second gate electrodes G1 and G2 of the first and second transistors T1 and T2. The first gate electrode G1 may be disposed to overlap the channel region of the first active layer ACT1 in a thickness direction, i.e., in the third direction DR3, and the second gate electrode G2 may be disposed to overlap the channel region of the second active layer ACT2 in the thickness direction, i.e., in the third direction DR3. Although not specifically illustrated, the second conductive layer may further include a first electrode of a storage capacitor.

The first interlayer insulating layer IL1 may be disposed on the second conductive layer. The first interlayer insulating layer IL1 may function as an insulating film between the second conductive layer and layers disposed on the second conductive layer and may protect the second conductive layer.

The third conductive layer may be disposed on the first interlayer insulating layer IL1. The third conductive layer may include the first and second voltage lines VL1 and VL2, the first conductive pattern CDP1, first and second source electrodes S1 and S2 of the first and second transistors T1 and T2 and first and second drain electrodes D1 and D2 of the first and second transistors T1 and T2, which may be all disposed in the display area DPA. Although not specifically illustrated, the third conductive layer may further include a second electrode of the storage capacitor.

A high-potential voltage (or a first power supply voltage) to be delivered to a first electrode RME1 may be applied to the first voltage line VL1, and a low-potential voltage (or a second power supply voltage) to be delivered to a second electrode RME2 may be applied to the second voltage line VL2. A portion of the first voltage line VL1 may be in contact with the first active layer ACT1 of the first transistor T1 through a contact hole that penetrates the first interlayer insulating layer IL1 and the first gate insulating layer GI. The first voltage line VL1 may function as a first drain electrode D1 of the first transistor T1. The second voltage line VL2 may be directly connected to the second electrode RME2.

The first conductive pattern CDP1 may be in contact with the active layer ACT1 of the first transistor T1 through a contact hole that penetrates the first interlayer insulating layer IL1 and the first gate insulating layer GI. Also, the first conductive pattern CDP1 may be in contact with the lower metal layer BML through another contact hole. The first conductive pattern CDP1 may function as a first source electrode S1 of the first transistor T1. The first conductive pattern CDP1 may be connected to the first electrode RME1 or a first connecting electrode CNE1 that will be described later. The first transistor T1 may transmit the first power supply voltage from the first voltage line VL1 to the first electrode RME1 or the first connecting electrode CNE1.

The second source electrode and the second drain electrode D2 may be in contact with the second active layer ACT2 of the second transistor T2 through contact holes penetrating the first interlayer insulating layer IL1 and the first gate insulating layer GI. The second transistor T2 may be one of the switching transistors described above with reference to FIG. 3. The second transistor T2 may transmit a signal applied from the data line DTL of FIG. 3 to the first transistor T1 or may transmit a signal applied from the initialization voltage line VIL of FIG. 3 to the second electrode of the storage capacitor.

The first passivation layer PV1 may be disposed on the third conductive layer. The first passivation layer PV1 may function as an insulating film between the third conductive layer and other layers and protect the third conductive layer.

Each of the buffer layer BL, the first gate insulating layer GI, the first interlayer insulating layer IL1, and the first passivation layer PV1 may consist of inorganic layers that may be alternately stacked on each other. For example, each of the buffer layer BL, the first gate insulating layer GI, the first interlayer insulating layer IL1, and the first passivation layer PV1 may be formed as a double- or multilayer in which inorganic layers of at least one of silicon oxide ($SiO_x$), silicon nitride ($SiN_x$), and silicon oxynitride ($SiO_xN_y$) may be alternately stacked on each other, but the disclosure is not limited thereto. In another example, each of the buffer layer BL, the first gate insulating layer GI, the first interlayer insulating layer IL1, and the first passivation layer PV1 may be formed as a single inorganic layer including silicon oxide ($SiO_x$), silicon nitride ($SiN_x$), and/or silicon oxynitride ($SiO_xN_y$). In some embodiments, the first interlayer insulating layer IL1 may be formed of an organic insulating material such as polyimide (PI).

A via layer VIA may be disposed on the third conductive layer, in the display area DPA. The via layer VIA may include an organic insulating material such as, for example, PI, and may perform a surface planarization function by compensating for any height differences generated by the underlying conductive layers. In some embodiments, the via layer VIA may not be provided.

The display device 10 may include, as a display element layer on the via layer VIA, the bank patterns (BP1 and BP2), the electrodes RME, the bank layer BNL, the light-emitting elements ED, and the connecting electrodes CNE. The display device 10 may include first through third insulating layers PAS1 through PAS3, which may be disposed on the via layer VIA.

The bank patterns (BP1 and BP2) may be disposed in the emission area EMA of the first subpixel SPX1. The bank patterns (BP1 and BP2) may have a width in the second direction DR2 and may extend in the first direction DR1.

For example, the bank patterns (BP1 and BP2) may include first and second bank patterns BP1 and BP2, which may be disposed in the emission area EMA of the first subpixel SPX1 to be spaced apart from one another in the second direction DR2. The first bank pattern BP1 may be disposed on a first side, in the second direction DR2, of the center of the emission area EMA, for example, on the left side of the emission area EMA, and the second bank pattern BP2 may be disposed on a second side, in the second direction DR2, of the center of the emission area EMA, for example, on the right side of the emission area EMA. The first and second bank patterns BP1 and BP2 may be arranged one after another in the second direction DR2 and may be disposed as islands in the display area DPA. The light-emitting elements ED may be disposed between the first and second bank patterns BP1 and BP2.

The lengths, in the first direction DR1, of the first and second bank patterns BP1 and BP2 may be the same and may be less than the length, in the first direction DR1, of the emission area EMA, surrounded by the bank layer BNL. The first and second bank patterns BP1 and BP2 may be spaced apart from portions of the bank layer BNL that extend in the second direction DR2, but the disclosure is not limited thereto. The bank patterns (BP1 and BP2) may be integrally formed with the bank layer BNL or may partially overlap the portions of the bank layer BNL that extend in the second direction DR2, in which case, the length, in the first direction DR1, of the bank patterns (BP1 and BP2) may be the same as, or greater than the length, in the first direction DR1, of the emission area EMA, surrounded by the bank layer BNL.

The first and second bank patterns BP1 and BP2 may have the same width in the second direction DR2, but the disclosure is not limited thereto. In other embodiments, the first and second bank patterns BP1 and BP2 may have different widths in the second direction DR2. For example, one of the first and second bank patterns BP1 and BP2 may have a larger width than another bank pattern and may be disposed across more than one subpixel SPXn adjacent to one another in the second direction DR2. In this example, whichever of the first and second bank patterns BP1 and BP2 may be wider than another bank pattern may overlap a portion of the bank layer BNL that extends in the first direction DR1, in the thickness direction. The first subpixel SPX1 is illustrated as having two bank patterns having the same width, but the disclosure is not limited thereto. The number and the shape of bank patterns provided in the first subpixel SPX1 may vary depending on the number and the layout of electrodes RME provided in the first subpixel SPX1.

The bank patterns (BP1 and BP2) may be disposed on the via layer VIA. For example, the bank patterns (BP1 and BP2) may be disposed directly on the via layer VIA and may protrude at least in part from the top surface of the via layer VIA. Each of protruding portions of the bank patterns (BP1 and BP2) may have inclined sides or curved sides with a curvature, and light emitted from the light-emitting elements ED may be reflected by the electrodes RME on the bank patterns (BP1 and BP2) to be emitted in an upward direction from the via layer VIA. In other embodiments, the bank patterns (BP1 and BP2) may have a curved shape with a curvature, for example, a semicircular or semielliptical shape, in a cross-sectional view. The bank patterns (BP1 and BP2) may include an inorganic insulating material such as PI, but the disclosure is not limited thereto.

The electrodes RME may extend in a direction to be disposed in the first subpixel SPX1. The electrodes RME may extend in the first direction DR1 to be disposed in the emission area EMA and the subarea SA of the first subpixel SPX1 and may be spaced apart from one another in the second direction DR2. The electrodes RME may be electrically connected to the light-emitting elements ED that will be described later, but the disclosure is not limited thereto. In other embodiments, the electrodes RME may not be electrically connected to the light-emitting elements ED.

The display device 10 may include, in the first subpixel SPX1, first and second electrodes RME1 and RME2. The first electrode RME1 may be disposed on the left side of the center of the emission area EMA, and the second electrode RME2 may be spaced apart from the first electrode RME1 in the second direction DR2 and may be disposed on the right side of the center of the emission area EMA. The first electrode RME1 may be disposed on the first bank pattern BP1, and the second electrode RME2 may be disposed on the second bank pattern BP2. The first and second electrodes RME1 and RME2 may be disposed in part on the outside of the emission area EA and in the subarea SA, beyond the bank layer BNL. First electrodes RME1 or second electrodes RME2 from two different subpixels SPXn may be spaced apart from each other by a separation part ROP of a subarea SA of one of the two different subpixels SPXn.

FIGS. 4 through 6 illustrate that two electrodes RME are disposed in the first subpixel SPX1 to extend in the first direction DR1, but the disclosure is not limited thereto. In other embodiments, the display device 10 may include more than two electrodes RME in the first subpixel SPX1, and the electrodes RME may be bent in part and may have different widths from one location to another location.

The electrodes RME may be disposed at least on inclined sides of the bank patterns (BP1 and BP2). The width, in the second direction DR2, of the electrodes RME may be less than the width, in the second direction DR2, of the bank patterns (BP1 and BP2), and the distance, in the second direction DR2, between the electrodes RME may be less than the distance, in the second direction DR2, between the bank patterns (BP1 and BP2). The first and second electrodes RME1 and RME2 may be disposed, at least in part, directly on the via layer VIA to be placed on the same plane.

The light-emitting elements ED, which may be disposed between the bank patterns (BP1 and BP2), emit light through both end portions thereof, and the emitted light may travel toward the electrodes RME on the bank patterns (BP1 and BP2). Portions of the electrodes RME that may be disposed on the bank patterns (BP1 and BP2) may have a structure capable of reflecting light emitted from the light-emitting elements ED. The first and second electrodes RME1 and RME2 may be disposed to cover at least sides of the bank patterns (BP1 and BP2) to reflect light emitted from the light-emitting elements ED.

The electrodes RME may be in direct contact with the third conductive layer through the electrode contact holes (CTD and CTS) in an area where the electrodes RME overlap the bank layer BNL, between the emission area EMA and the subarea SA. A first electrode contact hole CTD may be formed in a region where the bank layer BNL and the first electrode RME1 overlap each other, and a second electrode contact hole CTS may be formed in a region where the bank layer BNL and the second electrode RME2 overlap each other. The first electrode RME1 may be in contact with the first conductive pattern CDP1 through the first electrode contact hole CTD, which penetrates the via layer VIA and the first passivation layer PV1. The second electrode RME2 may be in contact with the second voltage line VL2 through the second electrode contact hole CTS, which penetrates the via layer VIA and the first passivation layer PV1. The first electrode RME1 may be electrically connected to the first transistor T1 through the first conductive pattern CDP1 and may thus receive the first power supply voltage, and the second electrode RME2 may be electrically connected to the second voltage line VL2 and may thus receive the second power supply voltage. However, the disclosure is not limited to this configuration. In other embodiments, the electrodes RME may not be electrically connected to the first and second voltage lines VL1 and VL2 of the third conductive layer and may be directly connected to the third conductive layer.

The electrodes RME may include a conductive material with high reflectance. For example, the electrodes RME may include a metal such as silver (Ag), copper (Cu), and/or aluminum (Al), an alloy including Al, nickel (Ni), and/or lanthanum (La), or a stack of a layer of such alloy and a layer of a metal such as titanium (Ti), molybdenum (Mo), and/or niobium (Nb). In some embodiments, the electrodes RME may be formed as double- or multilayers in which at least one layer of an alloy containing Al and at least one layer of a metal such as Ti, Mo, or Nb may be stacked on each other.

However, the disclosure is not so limited. In other embodiments, the electrodes RME may further include a transparent conductive material. For example, the electrodes RME may include a material such as ITO, IZO, or ITZO. In some embodiments, the electrodes RME may have a structure in which at least one layer of a transparent conductive material and at least one layer of a metal with high reflectance may be stacked on each other or may be formed as single-layer films including the transparent conductive material and the metal with high reflectance. For example, the electrodes RME may have a stack structure such as ITO/Ag/ITO, ITO/Ag/IZO, or ITO/Ag/ITZO/IZO. The electrodes RME may be electrically connected to the light-emitting elements ED and may reflect light some of light, emitted from the light-emitting elements ED, in an upward direction from the first substrate SUB.

The first insulating layer PAS1 may be disposed in the entire display area DPA, on the via layer VIA and the electrodes RME. The first insulating layer PAS1 may protect the electrodes RME and may insulate the electrodes RME from each other. Particularly, as the first insulating layer PAS1 may be disposed to cover the electrodes RME, before the formation of the bank layer BNL, the first insulating layer PAS1 can prevent the electrodes RME from being damaged during the formation of the bank layer BNL. Also, the first insulating layer PAS1 can prevent the light-emitting elements ED from being in direct contact with, and damaged by, other members.

The first insulating layer PAS1 may be formed to be recessed in part between the electrodes RME, which may be spaced apart from each other in the second direction DR2. The light-emitting elements ED may be disposed on the top surface of a recessed portion of the first insulating layer PAS1, and space may be formed between the light-emitting elements ED and the first insulating layer PAS1.

The bank layer BNL may be disposed on the first insulating layer PAS1. The bank layer BNL may include parts extending in the first direction DR1 and parts extending in the second direction DR2 and may surround the first subpixel SPX1. The bank layer BNL may be disposed along the boundaries of the display area DPA to separate the display area DPA and the non-display area NDA. The bank layer BNL may be disposed in the entire display area DPA to form a lattice shape, and portions of the display area DPA that may be opened by the bank layer BNL may include the emission area EMA and the subarea SA.

The bank layer BNL, like the bank patterns (BP1 and BP2), may have a height. In some embodiments, the height of the bank layer BNL may be greater than the height of the bank patterns (BP1 and BP2), and the thickness of the bank layer BNL may be the same as, or greater than, the thickness of the bank patterns (BP1 and BP2). The bank layer BNL may prevent ink from spilling into neighboring subpixels SPXn in an inkjet printing process as performed during the fabrication of the display device 10. The bank layer BNL, like the bank patterns (BP1 and BP2), may include an organic insulating material such as PI.

The light-emitting elements ED may be disposed in the emission area EMA of the first subpixel SPX1. The light-emitting elements ED may be disposed between the bank patterns (BP1 and BP2) and may be spaced apart from one another in the first direction DR1. The light-emitting elements ED may extend in a direction, and both end portions of each of the light-emitting elements ED may be disposed on different electrodes RME. The length of the light-emitting elements ED may be greater than the distance, in the second direction DR2, of the electrodes RME. The light-emitting elements ED may be arranged in a direction perpendicular to the direction in which the electrodes RME extend, i.e., in a direction perpendicular to the first direction DR1, but the disclosure is not limited thereto. The direction in which the light-emitting elements SED extend may be the second direction DR2 or a direction inclined from the second direction DR2.

The light-emitting elements ED may be disposed on the first insulating layer PAS1. The light-emitting elements ED may extend in a direction, and the direction in which the light-emitting elements ED extend may be parallel to the top surface of the first substrate SUB. As will be described later, each of the light-emitting elements ED may include multiple semiconductor layers that may be arranged in the direction in which the light-emitting elements ED extend, and the multiple semiconductor layers may be sequentially arranged in a direction parallel to the top surface of the first substrate SUB. However, the disclosure is not so limited. In other embodiments, the multiple semiconductor layers may be arranged in a direction perpendicular to the first substrate SUB.

The light-emitting elements ED of a subpixel SPXn may emit light of a different wavelength range from the light-emitting elements ED of another subpixel SPXn, depending on the materials of the semiconductor layers of each of the light-emitting elements ED of each subpixel SPXn, but the disclosure is not limited thereto. In other embodiments, the semiconductor layers of each of the light-emitting elements ED of a subpixel SPXn may include the same materials as the semiconductor layers of each of the light-emitting elements ED of another subpixel SPXn, so that the light-emitting elements ED of a subpixel SPXn may emit light of the same color as the light-emitting elements ED of another subpixel SPXn.

The light-emitting elements ED may be in contact with the connecting electrodes CNE to be electrically connected to the light-emitting elements RME and the conductive layers below the via layer VIA and may emit light of a particular wavelength range in response to electrical signals being applied thereto.

The second insulating layer PAS2 may be disposed on the light-emitting elements ED, the first insulating layer PAS1, and the bank layer BNL. The second insulating layer PAS2 may include pattern parts, which extend in the first direction DR1 between the bank patterns (BP1 and BP2) and may be disposed on the light-emitting elements ED. The pattern parts may be disposed to surround the outer surfaces of each of the light-emitting elements ED, but not to cover both sides or both end portions of each of the light-emitting elements ED. The pattern parts may form linear or island patterns in the first subpixel SPX1 in a plan view. The pattern portions of the second insulating layer PAS2 may protect the light-emitting elements ED and may fix the light-emitting elements ED during the fabrication of the display device 10. The second insulating layer PAS2 may be disposed to fill the space between the first insulating layer PAS1 and the light-emitting elements ED. Portions of the second insulating layer PAS2 may be disposed on the bank layer BNL and in the subarea SA.

The connecting electrodes CNE may be disposed on the electrodes RME and the bank patterns (BP1 and BP2). The connecting electrodes CNE may extend in a direction and may be spaced apart from each other. The connecting electrodes CNE may be in contact with the light-emitting elements ED and may be electrically connected to the third conductive layer.

The connecting electrodes CNE may include first and second connecting electrodes CNE1 and CNE2, which may be disposed in the first subpixel SPX1. The first connecting electrode CNE1 may partially overlap the first electrode RME1 and may be disposed not only in the emission area EMA, but also in the subarea SA, beyond the bank layer BNL. The second connecting electrode CNE2 may extend in the first direction DR1 and may be disposed on the second electrode RME2 or the second bank pattern BP2. The second connecting electrode CNE2 may partially overlap the second electrode RME2 and may be disposed not only in the emission area EMA, but also in the subarea SA, beyond the bank layer BNL. The first and second connecting electrodes CNE1 and CNE2 may be in contact with the light-emitting elements ED and may be electrically connected to the electrodes RME or the underlying conductive layers.

For example, the first and second connecting electrodes CNE1 and CNE2 may be disposed on side surfaces of the second insulating layer PAS2 and may be in contact with the light-emitting elements ED. The first connecting electrode CNE1 may partially overlap the first electrode RME1 and may be in contact with first end portions of the light-emitting elements ED. The second connecting electrode CNE2 may partially overlap the second electrode RME2 and may be in contact with second end portions of the light-emitting elements ED. The connecting electrodes CNE may be disposed not only in the emission area EMA, but also in the subarea SA beyond the emission area EMA. The connecting electrodes CNE may be in contact with the light-emitting elements ED, in the emission area EMA, and may be electrically connected to the third conductive layer, in the subarea SA.

The third insulating layer PAS3 may be disposed on the second connecting electrode CNE2 and the second insulating layer PAS2. The third insulating layer PAS3 may be disposed on the entire surface of the second insulating layer PAS2 to cover the second connecting electrode CNE2, and the first connecting electrode CNE1 may be disposed on the third insulating layer PAS3. The third insulating layer PAS3 may be disposed on the entire surface of the via layer VIA except for an area where the second connecting electrode CNE2 may be disposed.

The third insulating layer PAS3 may insulate the first and second connecting electrodes CNE1 and CNE2 from each other so that the first and second connecting electrodes CNE1 and CNE2 may not be in direct contact with each other.

Although not specifically illustrated, another insulating layer may be further disposed on the third insulating layer PAS3 and the first connecting electrode CNE1. The insulating layer may protect the members disposed on the first substrate SUB from an external environment.

The first through third insulating layers PAS1 through PAS3 may include an inorganic insulating material or an organic insulating material. For example, the first through third insulating layers PAS1 through PAS3 may all include an inorganic insulating material. In another example, the first and third insulating layers PAS1 and PAS3 may include an inorganic insulating material, and the second insulating layer PAS2 may include an organic insulating material. At least one of the first through third insulating layers PAS1 through PAS3 may have a structure in which multiple insulating layers may be alternately or repeatedly stacked on each other. The first through third insulating layers PAS1 through PAS3 may include at least one of silicon oxide (SiO$_x$), silicon nitride (SiN$_x$), and silicon oxynitride (SiO$_x$N$_y$). First through third insulating layers PAS1 through PAS3 may include the same material, some of the first through third insulating layers PAS1 through PAS3 may include the same material, or the first through third insulating layers PAS1 through PAS3 may include different materials.

The first and second connecting electrodes CNE1 and CNE2 may include different materials and may be disposed in different layers. The first connecting electrode CNE1 may be disposed on the third insulating layer PAS3, and the second connecting electrode CNE2 may be disposed between the second and third insulating layers PAS2 and PAS3. Portion of the second connecting electrode CNE2 may be disposed directly on the second insulating layer PAS2, and the third insulating layer PAS3 may cover the second connecting electrode CNE2. Portion of the first connecting electrode CNE1 may be disposed directly on the third insulating layer PAS3. The second connecting electrode CNE2 may be portion of a first connecting electrode layer disposed between the second and third insulating layers PAS2 and PAS3, and the first connecting electrode CNE1 may be portion of a second connecting electrode layer disposed on the third insulating layer PAS3.

The first and second connecting electrodes CNE1 and CNE2 may be electrically connected to the electrodes RME below the first insulating layer PAS1. The first and second connecting electrodes CNE1 and CNE2 may be in direct contact with the electrodes RME or may be electrically connected to the electrodes RME through electrode patterns from a different layer.

Figure 7:
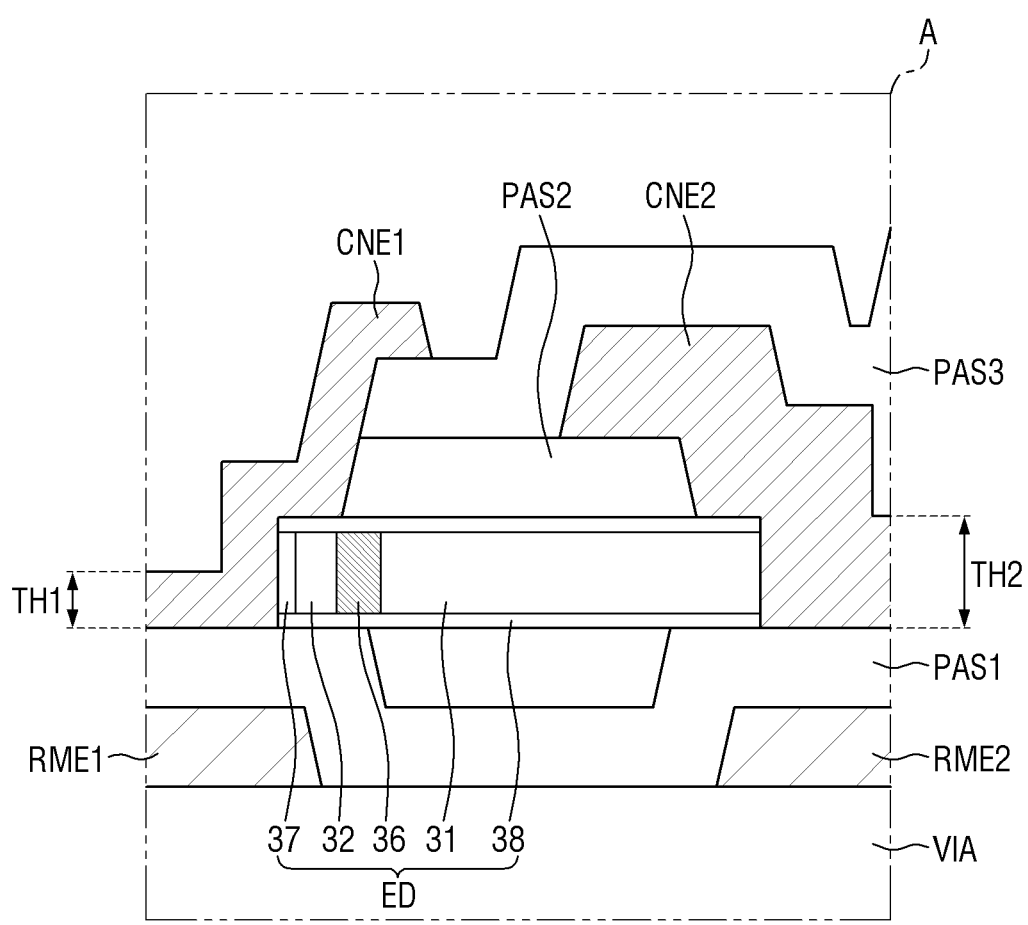
FIG. 7 is an enlarged schematic cross-sectional view of part A of FIG. 6.
Figure 8:
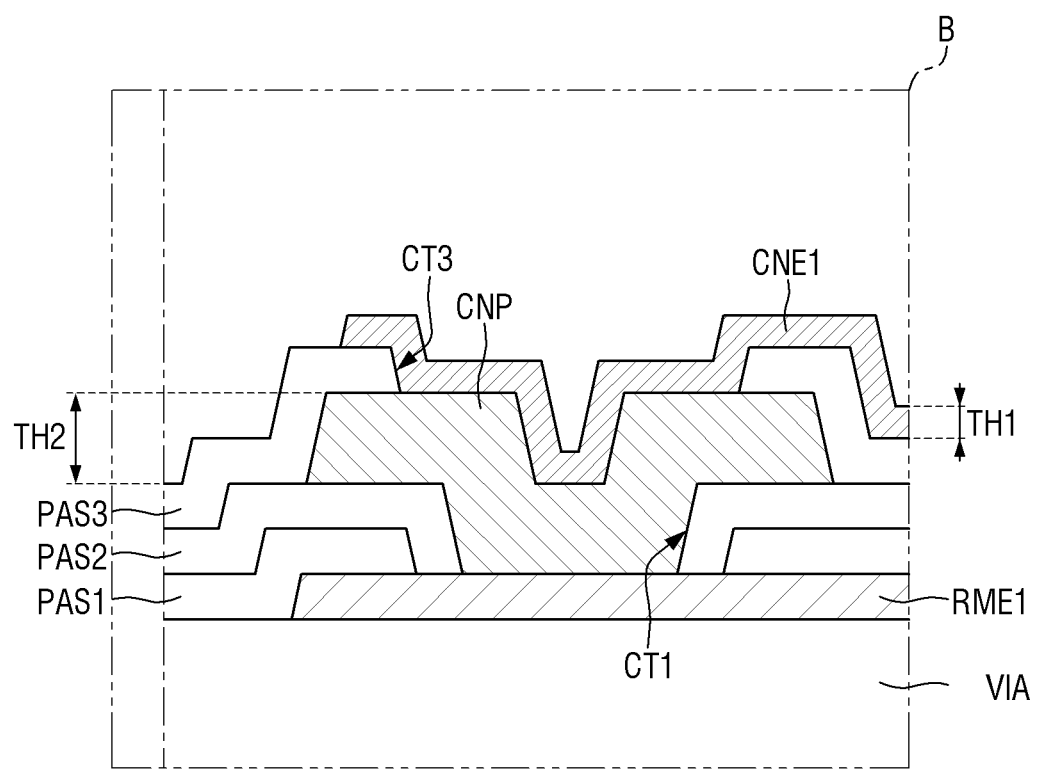
FIG. 8 is an enlarged schematic cross-sectional view of part B of FIG. 6.

FIG. 7 is an enlarged schematic cross-sectional view of part A of FIG. 6. FIG. 8 is an enlarged schematic cross-sectional view of part B of FIG. 6. FIG. 7 illustrates an area where the light-emitting elements ED may be disposed, and FIG. 8 illustrates an area where the first connecting electrode CNE1 and a connecting electrode pattern CNP may be disposed.

Referring to FIGS. 7 and 8 and further to FIGS. 4 through 6, the display device 10 may include the connecting electrode pattern CNP, which may be disposed between the second and third insulating layers PAS2 and PAS3. The first connecting electrode CNE1 may be electrically connected to the first electrode RME1 through the connecting electrode pattern CNP, and the second connecting electrode CNE2 may be in direct contact with the second electrode RME2 to be electrically connected to the second electrode RME2.

The connecting electrode pattern CNP may be disposed on the first electrode RME1, in the subarea SA of the first subpixel SPX1. The connecting electrode pattern CNP, which may be a layer between the second and third insulating layers PAS2 and PAS3, may be disposed in the same layer as the second connecting electrode CNE2, i.e., in the first connecting electrode layer. The connecting electrode pattern CNP may overlap the first electrode RME1 and the first connecting electrode CNE1, in the subarea SA.

The connecting electrode pattern CNP may be in direct contact with the first electrode RME1 through the first contact hole CT1, which penetrates the first and second insulating layers PAS1 and PAS2, in the subarea SA. The second connecting electrode CNE2 may be in direct contact with the second electrode RME2 through the second contact hole CT2, which penetrates the first and second insulating layers PAS1 and PAS2, in the subarea SA. The first connecting electrode CNE1 may be in direct contact with the connecting electrode pattern CNP through the third contact hole CT3, which penetrates the third insulating layer PAS3, in the subarea SA. The first and second contact holes CT1 and CT2 may be disposed to overlap the first and second electrodes RME1 and RME2, respectively, and may be spaced apart from each other in the second direction DR2. The first and third contact holes CT1 and CT3 may overlap each other in the thickness direction, but the disclosure is not limited thereto. For example, the first and third contact holes CT1 and CT3 may not overlap each other in the thickness direction, and the locations of the first and third contact holes CT1 and CT3 may vary depending on the shape and the location of the connecting electrode pattern CNP.

The connecting electrodes CNE may be electrically connected to the third conductive layer through the electrodes RME. The first connecting electrode CNE1 may be electrically connected to the first transistor T1 through the connecting electrode pattern CNP and the first electrode RME to receive the first power supply voltage, and the second connecting electrode CNE2 may be electrically connected to the second voltage line VL2 through the second electrode RME2 to receive the second power supply voltage. The connecting electrodes CNE may be in contact with the light-emitting elements ED, in the emission area EMA, to transmit a power supply voltage to the light-emitting elements ED.

The first and second connecting electrodes CNE1 and CNE2 and the connecting electrode pattern CNP may be in direct contact with the underlying layers through the first through third contact holes CT1 through CT3, which penetrate at least one of the first through third insulating layers PAS1 through PAS3. The first connecting electrode CNE1 may be in direct contact with the underlying layers through a contact hole (e.g., the third contact hole CT3) penetrating the third insulating layer PAS3, and the connecting electrode pattern CNP and the second connecting electrode CNE2 may be in direct contact with the underlying layers through contact holes (e.g., the first and second contact holes CT1 and CT2) penetrating two or more insulating layers (e.g., the first and second insulating layers PAS1 and PAS2). The first and second connecting electrodes CNE1 and CNE2 may be electrically connected to one of the electrodes RME through different contact holes penetrating at least one of the first through third insulating layers PAS1 through PAS3 on the electrodes RME, depending on the layer where they may each be disposed.

The second connecting electrode CNE2 and the connecting electrode pattern CNP of the first connecting electrode layer and the first connecting electrode CNE1 of the second connecting electrode layer may include different materials and may thus have different thicknesses. The first connecting electrode CNE1, the second connecting electrode CNE2, and the connecting electrode pattern CNP may include different conductive materials.

The second connecting electrode CNE2 and the connecting electrode pattern CNP of the first connecting electrode layer may be thicker than the first connecting electrode CNE1 of the second connecting electrode layer. As the first and second contact holes CT1 and CT2 penetrate two or more insulating layers (e.g., the first and second insulating layers PAS1 and PAS2), the depth of the first and second contact holes CT1 and CT2 may be greater than the depth of the third contact hole CT3. The second connecting electrode CNE2 and the connecting electrode pattern CNP of the first connecting electrode layer may be thick enough not to be disconnected due to height differences formed by the first through third insulating layers PAS1 through PAS3, even if the second connecting electrode CNE2 and the connecting electrode pattern CNP of the first connecting electrode layer may be in direct contact with the electrodes RME through the first and second contact holes CT1 and CT2, which may be relatively deep. On the contrary, as the third contact hole CT3 penetrates only one insulating layer (e.g., the third insulating layer PAS3), the depth of the third contact hole CT3 may be less than the depth of the first and second contact holes CT1 and CT2. As the first connecting electrode CNE1 of the second connecting electrode layer may be in contact with the connecting electrode pattern CNP through the third contact hole CT3, which may be relatively shallow, the first connecting electrode CNE1 of the second connecting electrode layer may not be disconnected by the height differences formed by the first through third insulating layers PAS1 through PAS3, even though the connecting electrode CNE1 of the second connecting electrode layer may be relatively thin.

For example, a thickness TH1 of the second connecting electrode CNE2 and the connecting electrode pattern CNP of the first connecting electrode layer may be 1000 Å to 3000 Å, and a thickness TH2 of the first connecting electrode CNE1 of the second connecting electrode layer may be 500 Å to 1000 Å. The first connecting electrode CNE1 may have a thickness of about 850 Å, and the second connecting electrode CNE2 and the connecting electrode pattern CNP may have a thickness of about 2000 Å. As the first and second connecting electrode layers include different materials depending on the depths of the first through third contact holes CT1 through CT3, through which the first and second connecting electrode layers may be connected to the underlying layers, the first and second connecting electrode layers can be prevented from being disconnected by the height differences formed by the first through third insulating layers PAS1 through PAS3.

The first connecting electrode CNE1 may include a transparent conductive material, and the second connecting electrode CNE2 and the connecting electrode pattern CNP may be thicker than the first connecting electrode CNE1 and may include an opaque conductive material or a reflective conductive material. For example, the first connecting electrode CNE1 may include at least one of ITO, IZO, IGO, IZTO, IGTO, and IGZTO, and the second connecting electrode CNE2 and the connecting electrode pattern CNP may include at least one of Ag, Cu, Al, Ni, La, Ti, Mo, Nb, and an alloy thereof. For example, the second connecting electrode CNE2 and the connecting electrode pattern CNP may include an alloy including Al, Ni, or La, an alloy including a metal such as Ti, Mo, or Nb, or a stack of a layer of such metal and a layer of such alloy. The first connecting electrode CNE1 may include ITO, and the second connecting electrode CNE2 and the connecting electrode pattern CNP may include a Ti—Cu alloy, or an Al alloy including Al, Ni, and La.

The first connecting electrode CNE1 may be in contact with the first end portions of the light-emitting elements ED, and the second connecting electrode CNE2 may be in contact with the second end portions of the light-emitting elements ED. As will be described later with reference to FIG. 9, each of the light-emitting elements ED may include a first semiconductor layer 31, a second semiconductor layer 32, and a light-emitting layer 36, which may be disposed between the first and second semiconductor layers 31 and 32 and generates light, and may further include an electrode layer 37, which may be disposed on the second semiconductor layer 32, and an insulating film 38, which surrounds the first semiconductor layer 31, the second semiconductor layer 32, and the light-emitting layer 36. The light-emitting layers 36 of the light-emitting elements ED may be disposed adjacent to the first end portions of the light-emitting elements ED.

Light may be generated in the light-emitting layers 36 of the light-emitting elements ED and may be emitted through the first end portions and the second end portions of the light-emitting elements ED. As the light-emitting element layers 36 may be disposed adjacent to the first end portions of the light-emitting elements ED, most of the light may be emitted through the first end portions of the light-emitting elements ED. As the first end portions of the light-emitting elements ED may be in contact with the first connecting electrode CNE1, which includes a transparent conductive material, the emission efficiency of the display device 10 can be maintained, even though the second connecting electrode CNE2 includes an opaque material. The layout of the first connecting electrode CNE1, which includes a transparent material, and the second connecting electrode CNE2, which includes an opaque material, may be determined by the alignment direction of the light-emitting elements ED. For example, if the first end portions of the light-emitting elements ED may be disposed on the first electrode RME1 and the second end portions of the light-emitting elements ED may be disposed on the second electrode RME2, the first connecting electrode CNE1, which includes a transparent material, may be disposed on the first electrode RME1, and the second connecting electrode CNE2, which includes an opaque material, may be disposed on the second electrode RME2. The display device 10 can provide a sufficient emission efficiency and can prevent any disconnections that may occur in case that the connecting electrodes CNE may be placed in contact with the electrodes RME.

Figure 9:
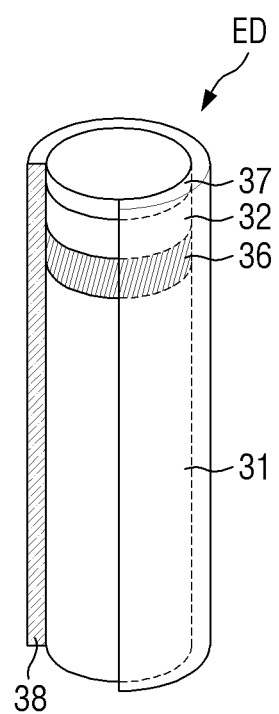
FIG. 9 is a schematic perspective view of a light-emitting element according to an embodiment of the disclosure.

FIG. 9 is a schematic perspective view of a light-emitting element according to an embodiment of the disclosure.

Referring to FIG. 9, a light-emitting element ED may be an LED. For example, the light-emitting element ED may be an ILED having a size of several nanometers or micrometers and formed of an inorganic material. If an electric field is formed in a particular direction between two opposite electrodes, the light-emitting element ED may be aligned between the two electrodes where polarities may be formed.

The light-emitting element ED may have a shape that extends in a direction. The light-emitting element ED may have the shape of a cylinder, a rod, a wire, or a tube, but the shape of the light-emitting element ED is not particularly limited. In other embodiments, the light-emitting element ED may have the shape of a polygonal column such as a regular cube, a rectangular parallelepiped, or a hexagonal column or may have a shape that extends in a direction but with a partially inclined outer surface.

The light-emitting element ED may include semiconductor layers doped with a dopant of an arbitrary conductivity type (e.g., a p type or an n type). The semiconductor layers may receive electric signals from an external power source to emit light of a particular wavelength range. The light-emitting element ED may include a first semiconductor layer 31, a second semiconductor layer 32, the light-emitting layer 36, an electrode layer 37, and the insulating film 38.

The first semiconductor layer 31 may include an n-type semiconductor. The first semiconductor layer 31 may include a semiconductor material, i.e., $Al_xGa_yIn_{1-x-y}N$ (where $0 \le x \le 1$, $0 \le y \le 1$, and $0 \le x+y \le 1$). For example, the first semiconductor layer 31 may include at least one of AlGaInN, GaN, AlGaN, InGaN, AlN, and InN that may be doped with an n-type dopant. The n-type dopant may be Si, Ge, Se, and/or Sn.

The second semiconductor layer 32 may be disposed on the first semiconductor layer 31 with the light-emitting layer 36 interposed therebetween. The second semiconductor layer 32 may include a p-type semiconductor. The second semiconductor layer 32 may include a semiconductor material, i.e., $Al_xGa_yIn_{1-x-y}N$ (where $0 \leq x \leq 1$, $0 \leq y \leq 1$, and $0 \leq x+y \leq 1$). For example, the second semiconductor layer 32 may include at least one of AlGaInN, GaN, AlGaN, InGaN, AlN, and InN that may be doped with a p-type dopant. The p-type dopant may be Mg, Zn, Ca, and/or Ba.

FIG. 9 illustrates that the first and second semiconductor layers 31 and 32 may be formed as single layers, but the disclosure is not limited thereto. In other embodiments, each of the first and second semiconductor layers 31 and 32 may include more than one layer such as, for example, a clad layer or a tensile strain barrier reducing (TSBR) layer, depending on the material of the light-emitting layer 36. For example, the light-emitting element ED may further include a semiconductor layer between the first semiconductor layer 31 and the light-emitting layer 36 or a semiconductor layer between the second semiconductor layer 32 and the light-emitting layer 36. The semiconductor layer between the first semiconductor layer 31 and the light-emitting layer 36 may include at least one of AlGaInN, GaN, AlGaN, InGaN, AlN and InN that may be doped with an n-type dopant, and the semiconductor layer between the second semiconductor layer 32 and the light-emitting layer 36 may include at least one of AlGaInN, GaN, AlGaN, InGaN, AlN, and InN that may be doped with a p-type dopant.

The light-emitting layer 36 may be disposed between the first and second semiconductor layers 31 and 32. The light-emitting layer 36 may include a single- or multi-quantum well structure material. In a case where the light-emitting layer 36 includes a material having a multi-quantum well structure, the light-emitting layer 36 may have a structure in which multiple barrier layers and multiple well layers may be alternately stacked on each other. The light-emitting layer 36 may emit light by combining electron-hole pairs in accordance with electric signals applied thereto via the first and second semiconductor layers 31 and 32. The light-emitting layer 36 may include a material such as AlGaN, AlGaInN, and/or InGaN. In particular, in a case where the light-emitting layer 36 has a multi-quantum well structure in which multiple barrier layers and multiple well layers may be alternately stacked on each other, the barrier layers may include a material such as AlGaN or AlGaInN, and the well layers may include a material such as GaN, InGaN, and/or AlInN.

The light-emitting layer 36 may have a structure in which a semiconductor material having a large band gap energy and a semiconductor material having a small band gap energy may be alternately stacked on each other or may include group-III or group-V semiconductor materials depending on the wavelength of light to be emitted. The type of light emitted by the light-emitting layer 36 is not particularly limited. The light-emitting layer 36 may emit light of a red or green wavelength range as necessary, instead of blue light.

The electrode layer 37 may be an ohmic connecting electrode, but the disclosure is not limited thereto. In other embodiments, the electrode layer 37 may be a Schottky connecting electrode. The light-emitting element ED may include at least one electrode layer 37. The light-emitting element ED may include more than one electrode layer 37, but the disclosure is not limited thereto. In other embodiments, the electrode layer 37 may not be provided.

The electrode layer 37 may reduce the resistance between the light-emitting element ED and electrodes RME or (connecting electrodes CNE) in case that the light-emitting element ED is electrically connected to the electrodes RME or (the connecting electrodes CNE). The electrode layer 37 may include a conductive metal. For example, the electrode layer 37 may include at least one of Al, Ti, In, Au, Ag, ITO, IZO, and ITZO.

The insulating film 38 may be disposed to surround the first and second semiconductor layers 31 and 32 and the electrode layer 37. For example, the insulating film 38 may be disposed to surround at least the light-emitting layer 36, but to expose both end portions, in the length direction, of the light-emitting element ED. The insulating film 38 may be formed to be rounded in a cross-sectional view, in a region adjacent to at least one end of the light-emitting element ED.

The insulating film 38 may include a material with insulating properties such as, for example, silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), titanium oxide ($TiO_x$), or a combination thereof. The insulating film 38 is illustrated as being a single-layer film, but the disclosure is not limited thereto. In other embodiments, the insulating film 38 may be formed as a multilayer film in which multiple layers may be stacked on each other.

The insulating film 38 may protect the first and second semiconductor layers 31 and 32 and the electrode layer 37. The insulating film 38 can prevent any short circuit that may occur in the light-emitting element 36 in case that the light-emitting element ED is in direct contact with electrodes to which electric signals may be applied. Also, the insulating film 38 can prevent the degradation of the emission efficiency of the light-emitting element ED.

The outer surface of the insulating film 38 may be subjected to surface treatment. The light-emitting element ED may be sprayed on electrodes while being dispersed in ink. Here, the surface of the insulating film 38 may be hydrophobically or hydrophilically treated to keep the light-emitting element ED dispersed in ink without agglomerating with other neighboring light-emitting elements ED.

Display devices according to other embodiments of the disclosure will hereinafter be described.

Figure 10:
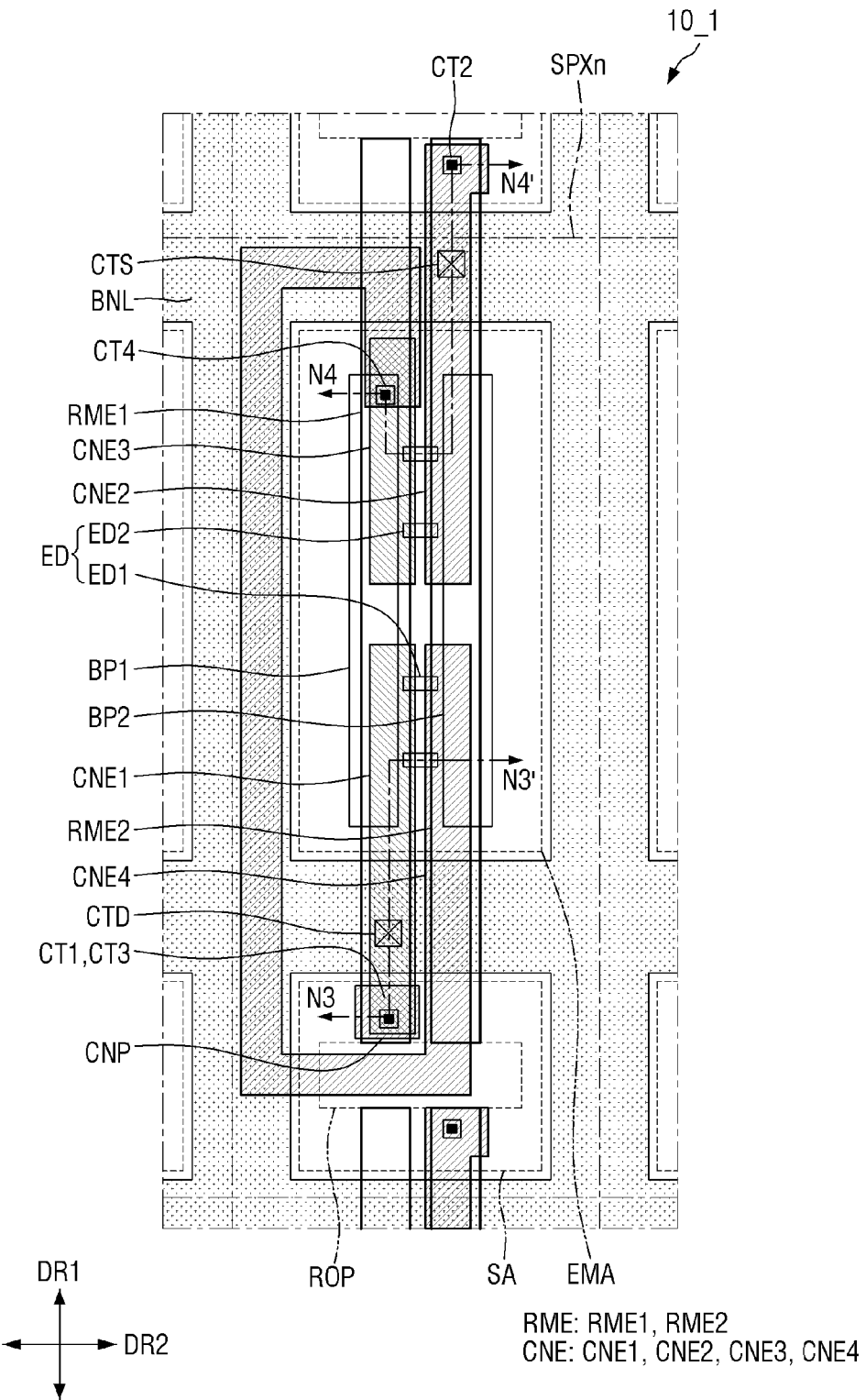
FIG. 10 is a schematic plan view of a subpixel of a display device according to another embodiment of the disclosure.

FIG. 10 is a schematic plan view of a subpixel of a display device according to another embodiment of the disclosure. FIG. 10 illustrates the layout of electrodes RME, bank patterns (BP1 and BP2), a bank layer BNL, light-emitting elements ED, and connecting electrodes CNE in a pixel PX of a display device 10_1.

Referring to FIG. 10, the display device 10_1 may include more connecting electrodes CNE in each subpixel SPXn than the display device 10 of FIG. 4. The display device 10_1 may differ from the display device 10 of FIG. 4 at least in that a larger number of connecting electrodes CNE may be provided in each subpixel SPXn so that some light-emitting elements ED can be connected in series. The display device 10_1 will hereinafter be described, focusing on the differences with the display device 10 of FIG. 4.

Figure 11:
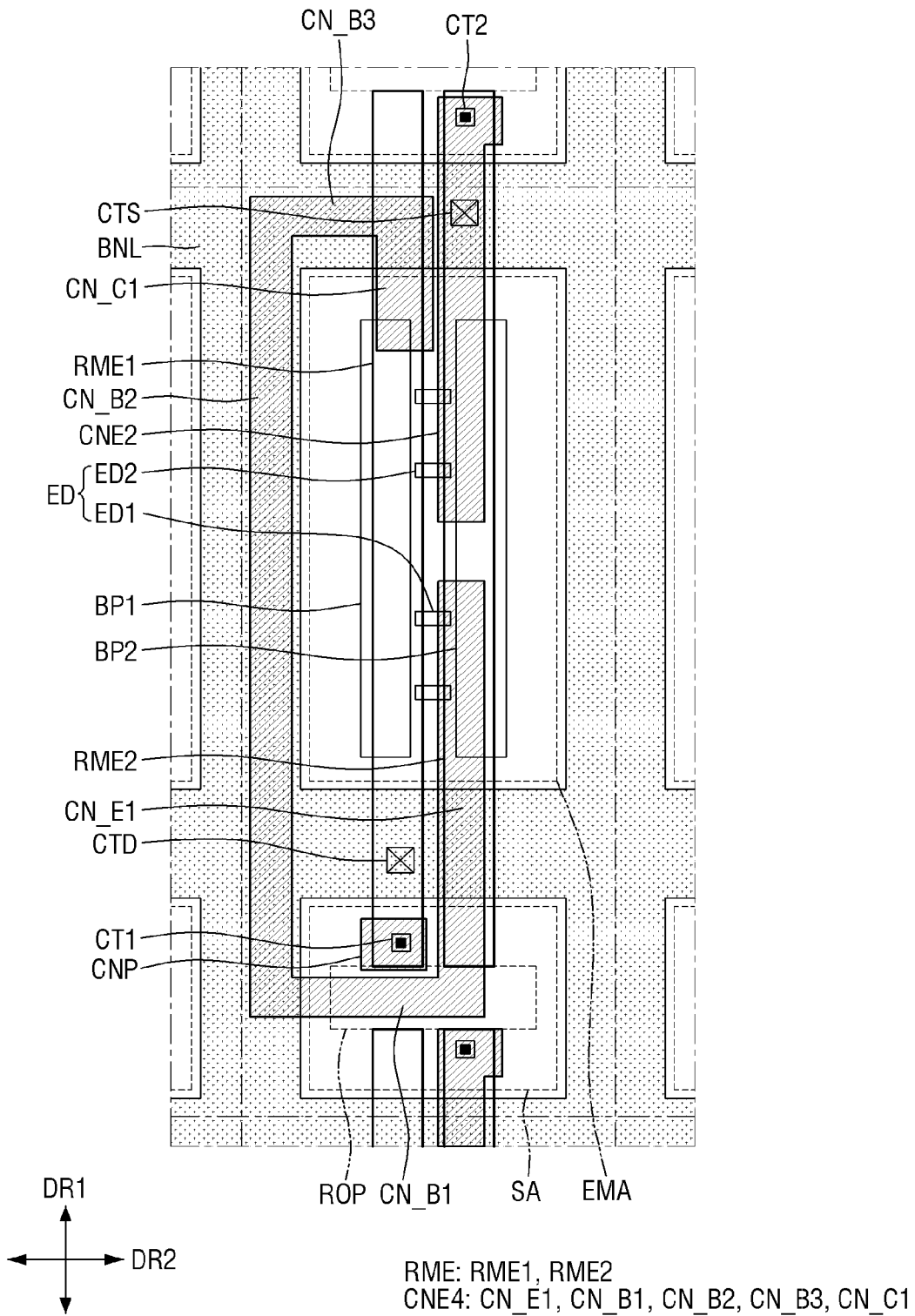
FIG. 11 is a schematic plan view of a first connecting electrode layer disposed in the subpixel of FIG. 10.
Figure 12:
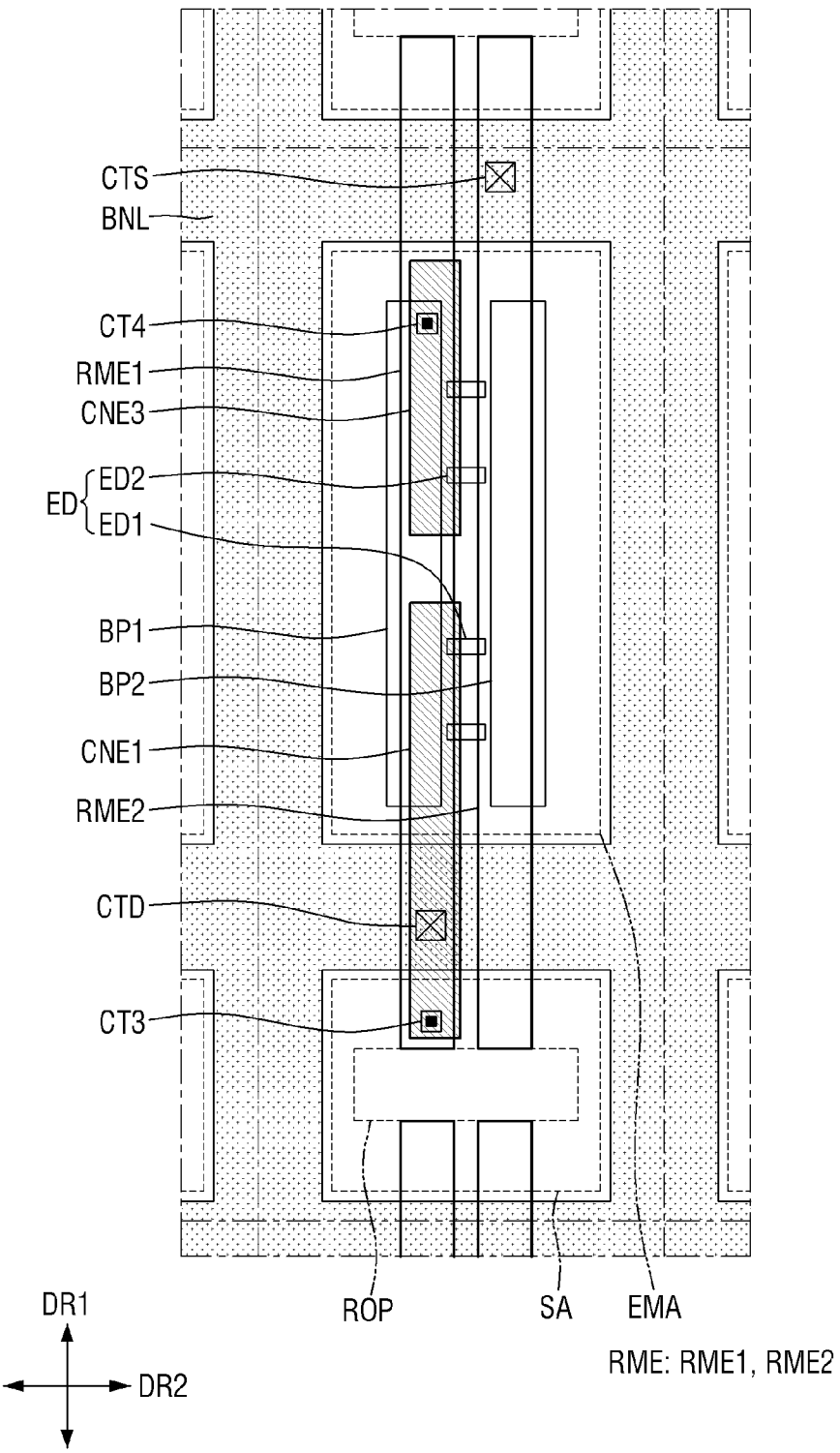
FIG. 12 is a schematic plan view of a second connecting electrode layer disposed in the subpixel of FIG. 10.
Figure 13:
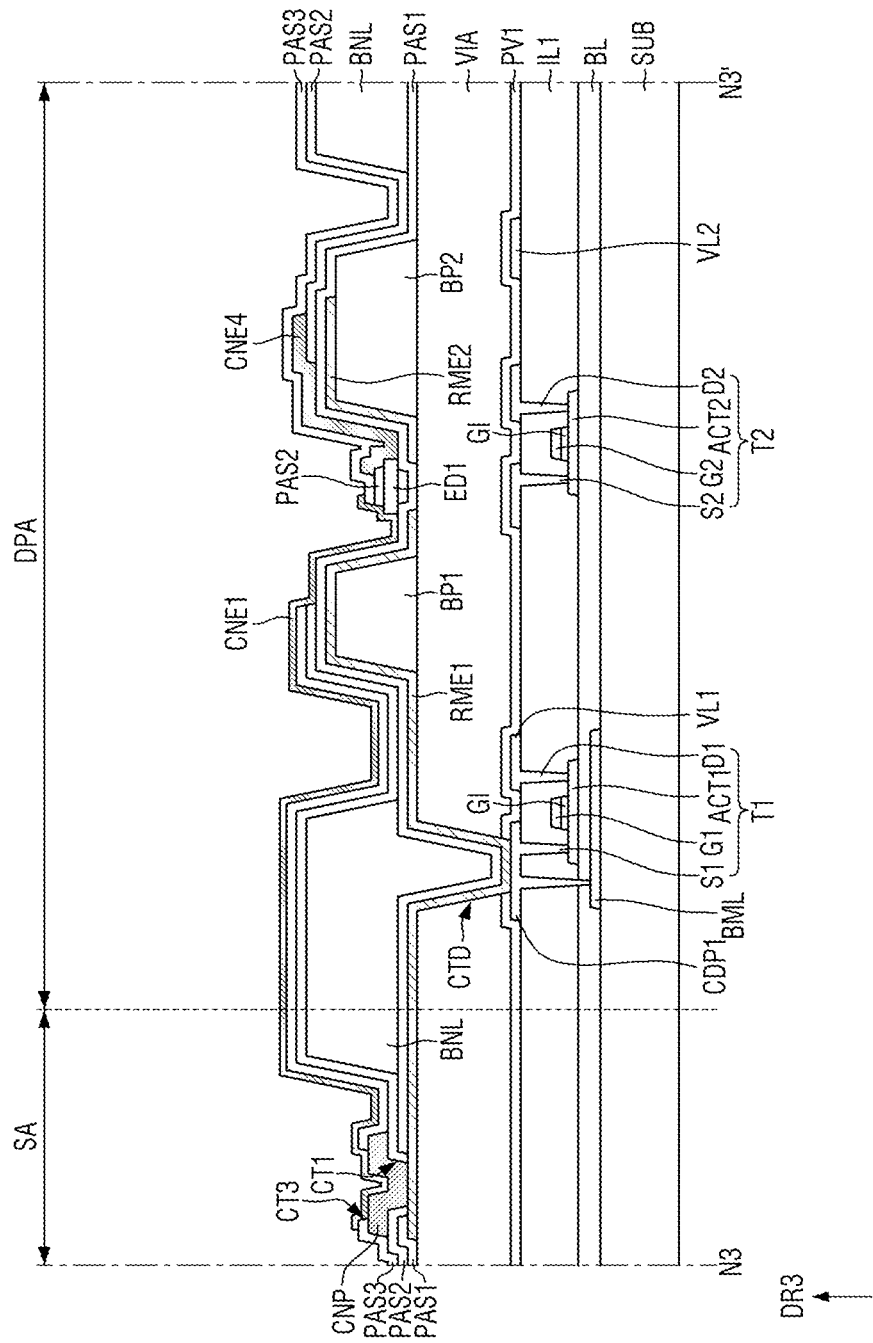
FIG. 13 is a schematic cross-sectional view taken along line N3-N3' of FIG. 10.
Figure 14:
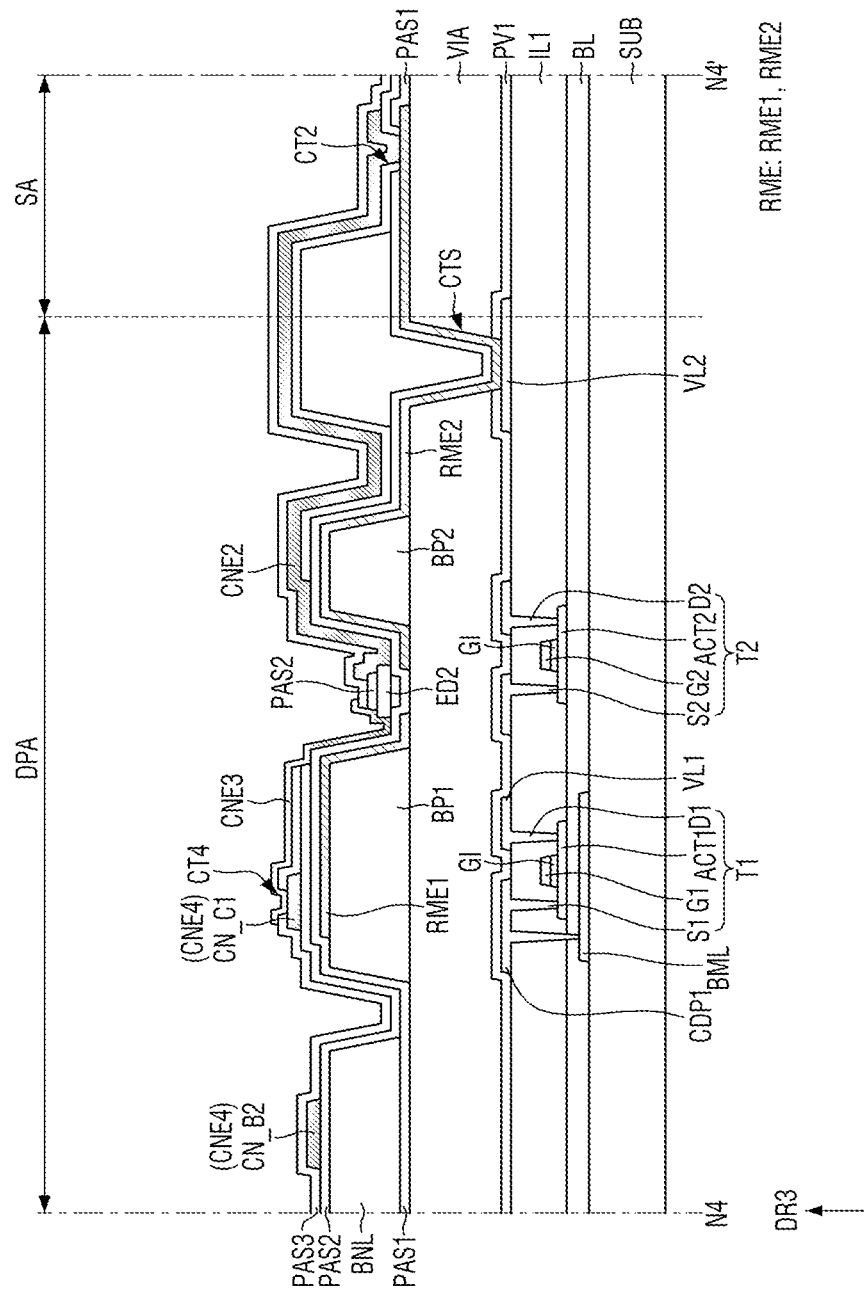
FIG. 14 is a schematic cross-sectional view taken along line N4-N4' of FIG. 10.

FIG. 11 is a schematic plan view of a first connecting electrode layer disposed in the subpixel of FIG. 10. FIG. 12 is a schematic plan view of a second connecting electrode layer disposed in the subpixel of FIG. 10. FIG. 13 is a schematic cross-sectional view taken along line N3-N3' of FIG. 10. FIG. 14 is a schematic cross-sectional view taken along line N4-N4' of FIG. 10.

FIGS. 11 and 12 illustrate the layout of the first through fourth connecting electrodes CNE1 through CNE4, which may be from different connecting electrode layers, in the subpixel SPXn of FIG. 10. FIG. 13 illustrates a cross-sectional view taken across a first light-emitting element ED1 and first and third contact holes CT1 and CT3 in a subpixel SPXn of FIG. 10, and FIG. 14 illustrates a cross-sectional view taken across a second light-emitting element ED2 and second and fourth contact holes CT2 and CT4 in the subpixel SPXn of FIG. 10.

Referring to FIGS. 11 through 14 and further to FIG. 10, the connecting electrodes CNE may include the first and second connecting electrodes CNE1 and CNE2 and may further include the third and fourth connecting electrodes CNE3 and CNE4.

The first connecting electrode CNE1 may be disposed on a first electrode RME1 and may be included in a second connecting electrode layer disposed on a third insulating layer PAS3. In the embodiment of FIG. 10, unlike in the embodiment of FIG. 4, the first connecting electrode CNE1 may be relatively short in a first direction DR1 and may be disposed on the lower side of the center of an emission area EMA of the subpixel SPXn of FIG. 10. The first connecting electrode CNE1 may be disposed in and across the emission area EMA and a subarea SA of the subpixel SPXn of FIG. 10. The first connecting electrode CNE1 may be in contact with first end portions of light-emitting elements ED disposed in a lower portion of the emission area EMA. The first connecting electrode CNE1 may be in direct contact with a connecting electrode pattern CNP through a third contact hole CT3, which penetrates a third insulating layer PAS3, in the subarea SA and may be electrically connected to the first electrode RME1.

The second connecting electrode CNE2 may be disposed on a second electrode RME2 and may be included in a first connecting electrode layer disposed between a second insulating layer PAS2 and the third insulating layer PAS3. In the embodiment of FIG. 10, unlike in the embodiment of FIG. 4, the second connecting electrode CNE2 may be relatively short in the first direction DR1 and may be disposed on the upper side of the center of the emission area EMA. The second connecting electrode CNE2 may be disposed in and across the emission area EMA and a subarea SA of an upper neighboring subpixel SPXn, which may be on the upper side of the emission area EMA. The second connecting electrode CNE2 may be in direct contact with second end portions of light-emitting elements ED disposed in an upper portion of the emission area EMA. The second connecting electrode CNE2 may be in direct contact with the second electrode RME2 through a second contact hole CT2, which penetrates the second and third insulating layers PAS2 and PAS3, in the subarea SA of the upper neighboring subpixel SPXn and may be electrically connected to the second electrode RME2.

The connecting electrode pattern CNP may be disposed in the subarea SA. The connecting electrode pattern CNP may be disposed to overlap the first electrode RME1 and may be in direct contact with the first electrode RME1. The connecting electrode pattern CNP may be directly connected to the first electrode RME1 through the first contact hole CT1, which penetrates a first insulating layer PAS1 and the second insulating layer PAS2.

The third connecting electrode CNE3 may be disposed on the first electrode RME1 and may be included in the second connecting electrode layer disposed on the third insulating layer PAS3. The third connecting electrode CNE3 may be spaced apart from the first connecting electrode CNE1 in the first direction DR1 and may face the second connecting electrode CNE2 in a second direction DR2. The third connecting electrode CNE3 may be in contact with first end portions of the light-emitting elements ED disposed in the upper portion of the emission area EMA. The third connecting electrode CNE3 may be disposed in the emission area EMA and may be shorter than the first connecting electrode CNE1 in the first direction DR1. The third connecting electrode CNE3 may not be directly connected to the first or second electrode RME1 or RME2.

The fourth connecting electrode CNE4 may be included in the first connecting electrode layer disposed between the second and third insulating layers PAS2 and PAS3. The fourth connecting electrode CNE4 may include a first extension portion CN_E1, which may be disposed in the emission area EMA, a first connecting portion CN_C1, which may be in contact with the third connecting electrode CNE3, and first through third bypass portions CN_B1 through CN_B3, which connect the first extension portion CN_E1 and the first connecting portion CN_C1.

The first extension portion CN_E1 of the fourth connecting electrode CNE4 may be disposed on the second electrode RME2 to be spaced apart from the second connecting electrode CNE2 in the first direction DR1 and may face the first connecting electrode CNE1 in the second direction DR2. The first extension portion CN_E1 of the fourth connecting electrode CNE4 may be in contact with second end portions of the light-emitting elements ED disposed in the lower portion of the emission area EMA. The first extension portion CN_E1 may be disposed in and across the emission area EMA and the subarea SA.

The fourth connecting electrode CNE4 may include the first through third bypass portions CN_B1 through CN_B3 and the first connecting portion CN_C1, and the first extension portion CN_E1 may be electrically connected to the third connecting electrode CNE. The fourth connecting electrode CNE4 may include the first through third bypass portions CN_B1 through CN_B3, which connect the first extension CN_E1 and the first connecting portion CN_C1. The first through third bypass portions CN_B1 through CN_B3 of the fourth connecting portion CNE4 may bypass the emission area EMA or the first connecting electrode CNE1 to be connected to the third connecting electrode CNE3. The first through third bypass portions CN_B1 through CN_B3 of the fourth connecting electrode CNE4 may be spaced apart from the first connecting electrode CNE1.

The first bypass portion CN_B1 may be disposed in the subarea SA, which may be disposed on the lower side of the emission area EMA, to extend in the second direction DR2. The first bypass portion CN_B1 may be spaced apart from the connecting electrode pattern CNP and the first connecting electrode CN1 in the first direction DR1. The first bypass portion CN_B1 may be connected to the first extension portion CN_E1 and may extend in the second direction DR2 over a bank layer BNL, in the subarea SA. The second bypass portion CN_B2 may extend in the first direction DR1 over the bank layer BNL. The second bypass portion CN_B2 may be connected to the first bypass portion CN_B1 to extend to portion of the bank layer BNL on the upper side of the emission area EMA. The third bypass portion CN_B3 may extend in the second direction DR2 over the bank layer BNL. The third bypass portion CN_B3 may be connected to the second bypass portion CN_B2 to partially overlap the first electrode RME1 and may extend to be spaced apart from the second connecting electrode CNE2. The first connecting portion CN_C1 may be connected to the third bypass portion CN_B3 and may extend in the first direction DR1. The first connecting portion CN_C1 may be long enough to overlap the third connecting electrode CNE3, from the portion of the bank layer BNL on the upper side of the emission area EMA. The first connecting portion CN_C1 may be directly connected to the third connecting electrode CNE3 through the fourth contact hole CT4, which penetrates the third insulating layer PAS3. The first through third contact holes CT1 through CT3 may be disposed in the subarea SA of the subpixel SPXn of FIG. 10 or in the subarea SA of the upper neighboring subpixel SPXn, but the fourth contact hole CT4 may be disposed in the emission area EMA.

The first extension portion CN_E1, the first through third bypass portions CN_B1 through CN_B3, and the first connecting portion CN_C1 of the fourth connecting electrode CNE4 may be incorporated into a single pattern. The fourth connecting electrode CNE4 may include the first extension portion CN_E1, which may be in direct contact with the light-emitting elements ED, the first through third bypass portions CN_B1 through CN_B3, which bypass the emission area EMA and the first connecting electrode CNE1 over the bank layer BNL, and the first connecting portion CN_C1, which may be directly connected to the third connecting electrode CNE3. The fourth connecting electrode CNE4 may not be directly connected to the electrodes RME, but may be electrically connected to the third connecting electrode CNE3.

The first and second connecting electrodes CNE1 and CNE2 may be first-type connecting electrodes that may be directly connected to the electrodes RME through the first through third contact holes CT1 through CT3, which may be disposed in the subarea SA of the subpixel SPXn of FIG. 10 or in the subarea SA of the upper neighboring subpixel SPXn, or electrically connected to the electrodes RME through the connecting electrode pattern CNP. The third and fourth connecting electrodes CNE3 and CNE4 may be second-type connecting electrodes that may not be directly connected to the electrodes RME.

The second and fourth connecting electrodes CNE2 and CNE4 may be portions of the first connecting electrode layer, and the first and third connecting electrodes CNE1 and CNE3 may be portions of the second connecting electrode layer. The first and third connecting electrodes CNE1 and CNE3, which correspond to the second connecting electrode layer, may be in contact with the first end portions of the light-emitting elements ED. The second and fourth connecting electrodes CNE2 and CNE4, which correspond to the first connecting electrode layer, may be in contact with the second end portions of the light-emitting elements ED. The second and fourth connecting electrodes CNE2 and CNE4 may include an opaque conductive material, and the first and third connecting electrodes CNE1 and CNE3 may include a transparent conductive material. In the embodiment of FIG. 10, like in the embodiment of FIG. 4, the second and fourth connecting electrodes CNE2 and CNE4 may be thicker than the first and third connecting electrodes CNE1 and CNE3. The first and third connecting electrodes CNE1 and CNE3 may include the same material, for example, at least one of ITO, IZO, and ITZO. The second and fourth connecting electrodes CNE2 and CNE4 and the connecting electrode pattern CNP may include the same material, for example, a metal including Al, Ni, and/or La, an alloy including a metal such as Ti, Mo, and/or Nb, or a stack of a layer of such metal and a layer of such alloy.

The light-emitting elements ED may be classified into different groups according to which of the connecting electrodes CNE they are each in contact with. First end portions of first light-emitting elements ED1 may be in contact with the first connecting electrode CNE1, and second end portions of the first light-emitting elements ED1 may be in contact with the fourth connecting electrode CNE4. First end portions of the second light-emitting elements ED2 may be in contact with the third connecting electrode CNE3, and second end portions of the second light-emitting elements ED2 may be in contact with the second connecting electrode CNE2. The first end portions of the first light-emitting elements ED1 may be electrically connected to the first electrode RME1, and the second end portions of the second light-emitting elements ED2 may be electrically connected to the second electrode RME2. The second end portions of the first light-emitting elements ED1 and the first end portions of the second light-emitting elements ED2 may be electrically connected through the third and fourth connecting electrodes CNE3 and CNE4. The light-emitting elements ED may be connected in series via the connecting electrodes CNE.

The display device 10_1 may include a relatively large number of connecting electrodes CNE in each subpixel SPXn. The connecting electrodes CNE may be spaced in part from one another in the emission area EMA, and the light-emitting elements ED may be classified according to which of the connecting electrodes CNE they are each in contact with. As the display device 10_1 includes a connecting electrode CNE bypassing the emission area EMA and the first connecting electrode CNE1 in each subpixel SPXn, the serial connections between the light-emitting elements ED can be configured, and the amount of light emitted per unit area can be further increased.

Figure 15:
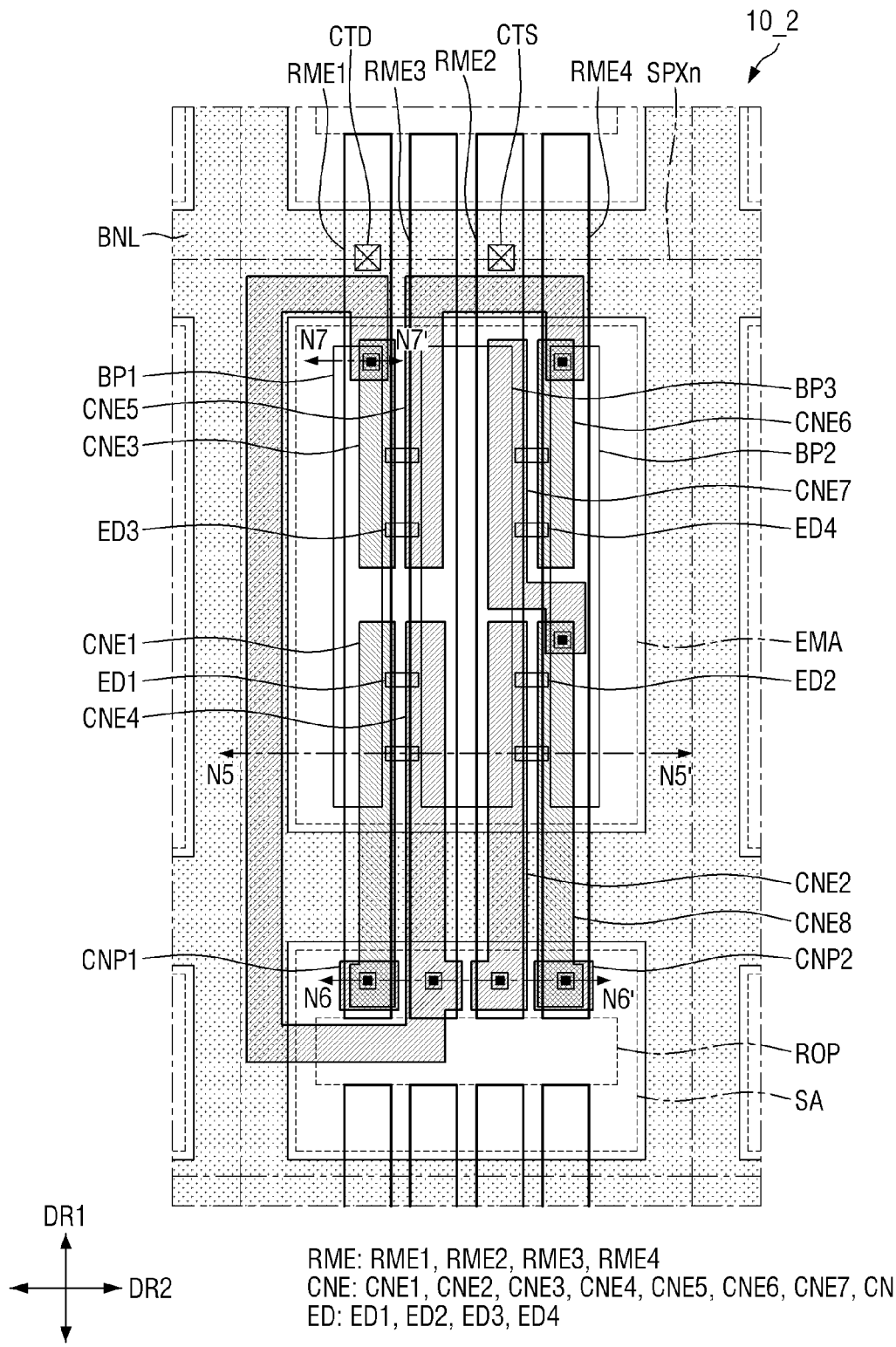
FIG. 15 is a schematic plan view of a subpixel of a display device according to another embodiment of the disclosure.

FIG. 15 is a schematic plan view of a subpixel of a display device according to another embodiment of the disclosure. FIG. 15 illustrates the layout of electrode RME, bank patterns (BP1 through BP3), a bank layer BNL, light-emitting elements ED, and connecting electrodes CNE in a pixel PX of a display device 10_2.

Referring to FIG. 15, the display device 10_2 may include more electrodes RME, more bank patterns (BP1 through BP3), more light-emitting elements ED, and more connecting electrodes CNE in each subpixel SPXn than the display device 10 of FIG. 4. The display device 10_2 may differ from the display device 10 of FIG. 4 at least in that larger numbers of electrodes RME and light-emitting elements ED may be provided. The display device 10_2 will hereinafter be described, focusing on the differences with the display device 10 of FIG. 4.

Figure 16:
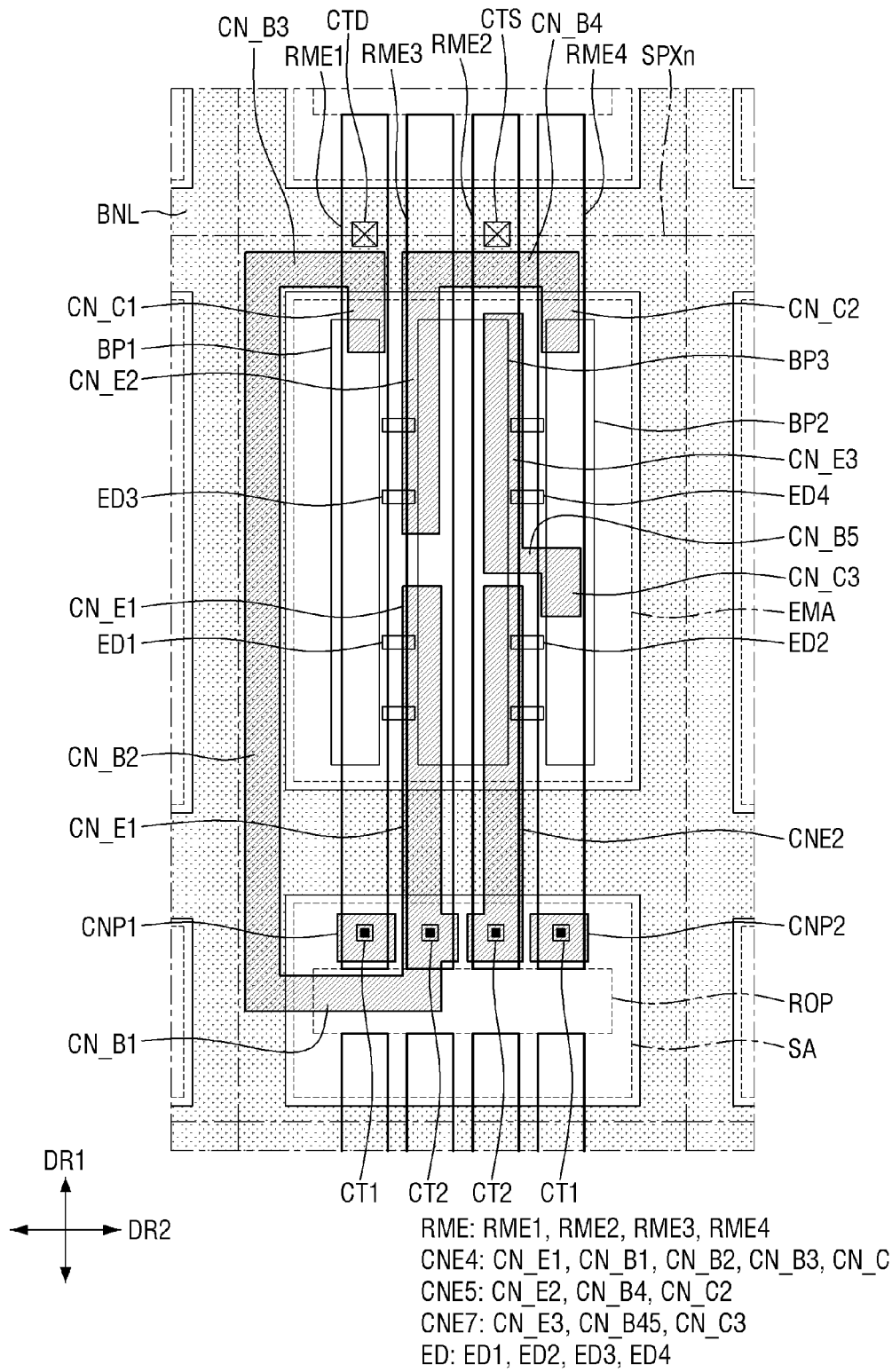
FIG. 16 is a schematic plan view of a first connecting electrode layer disposed in the subpixel of FIG. 15.
Figure 17:
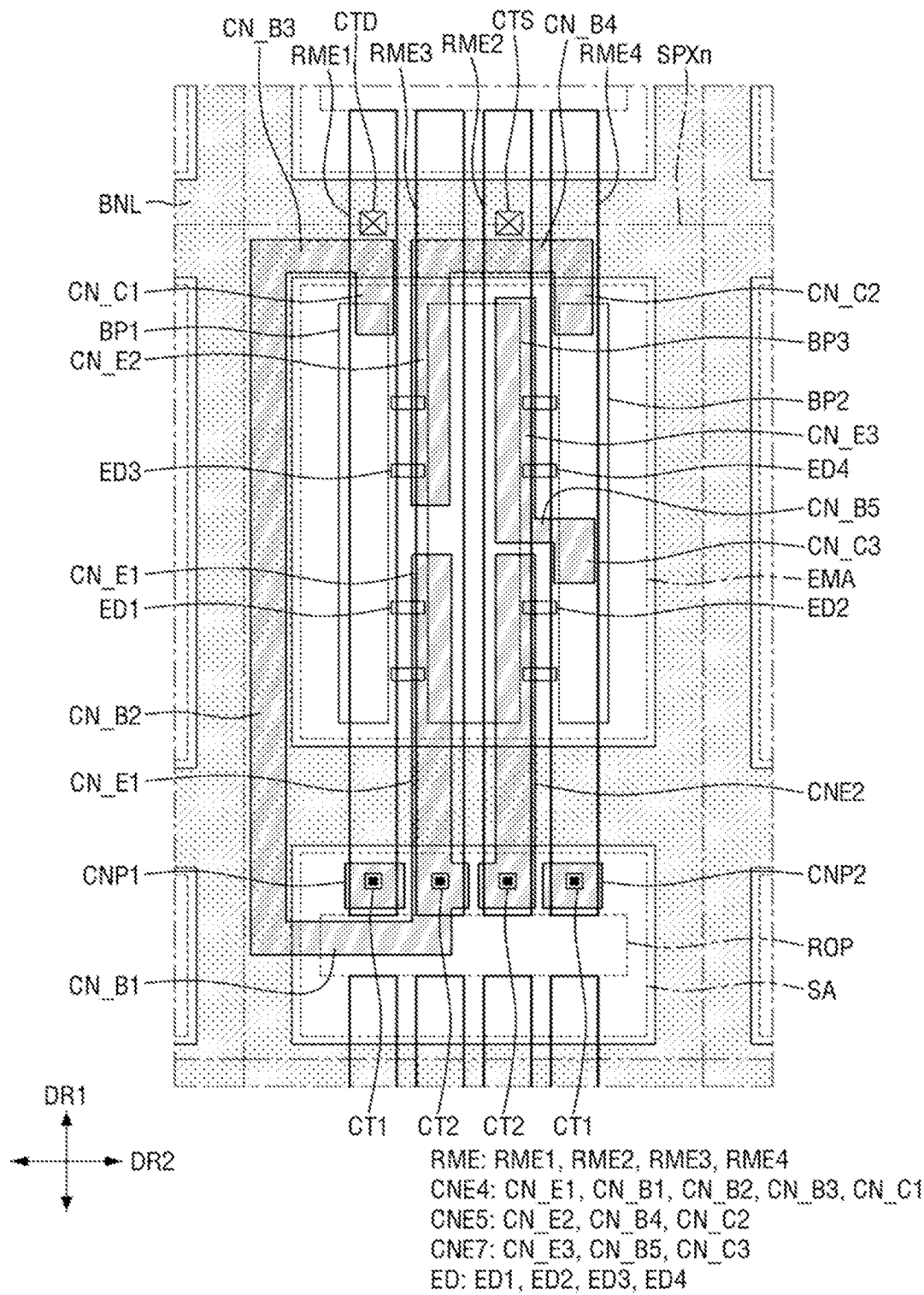
FIG. 17 is a schematic plan view of a second connecting electrode layer disposed in the subpixel of FIG. 15.
Figure 18:
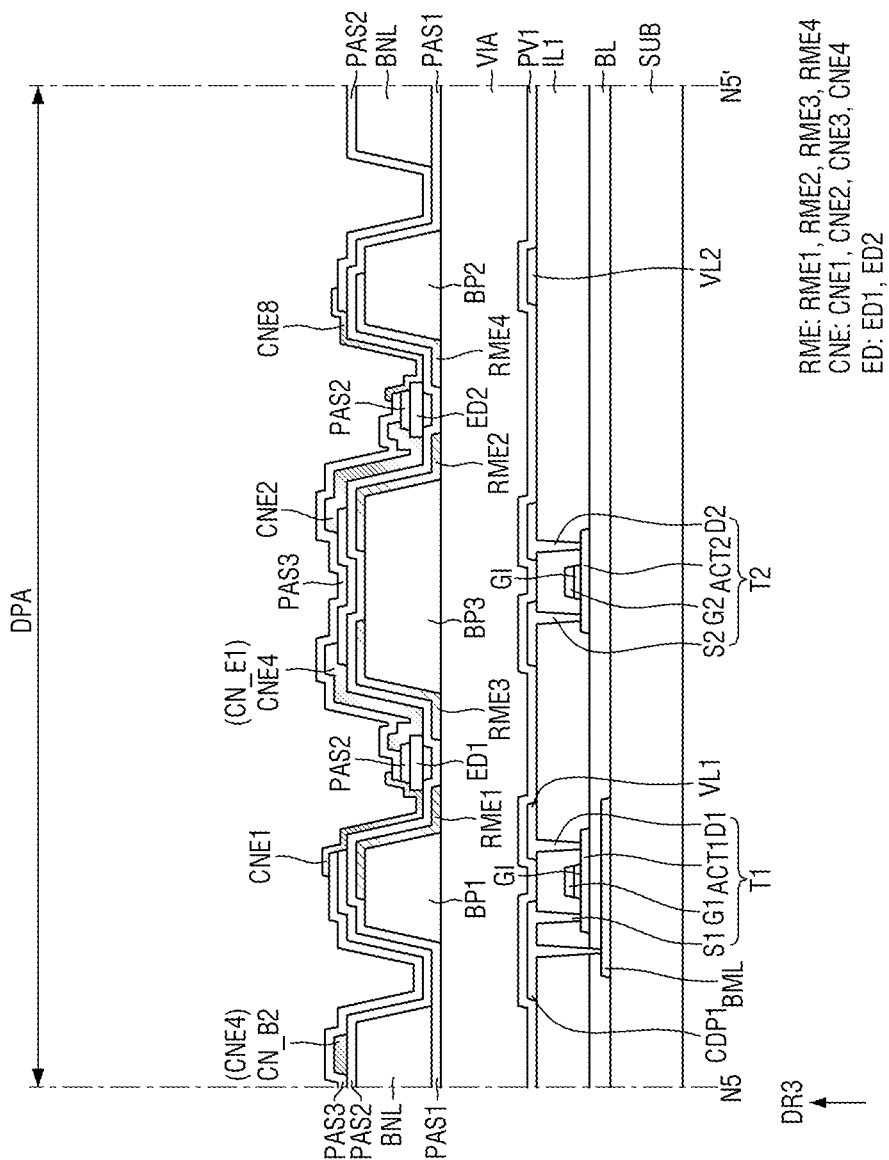
FIG. 18 is a schematic cross-sectional view taken along line N5-N5' of FIG. 15.
Figure 19:
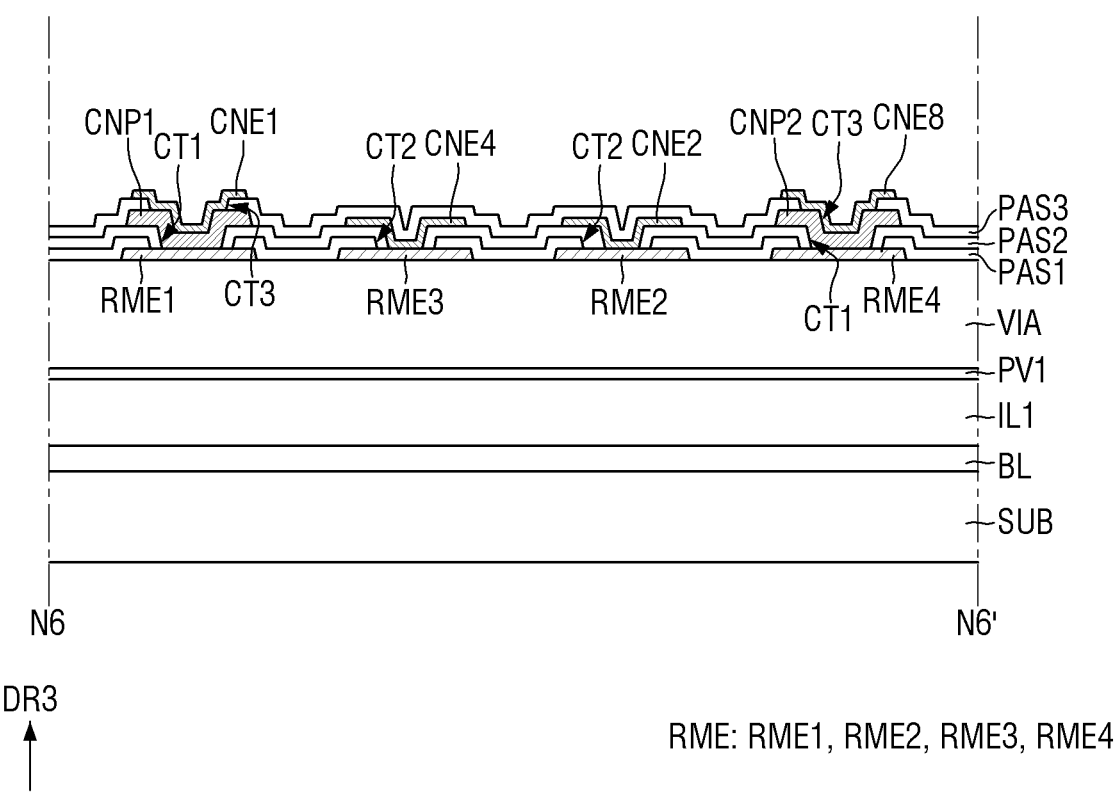
FIG. 19 is a schematic cross-sectional view taken along line N6-N6' of FIG. 15.
Figure 20:
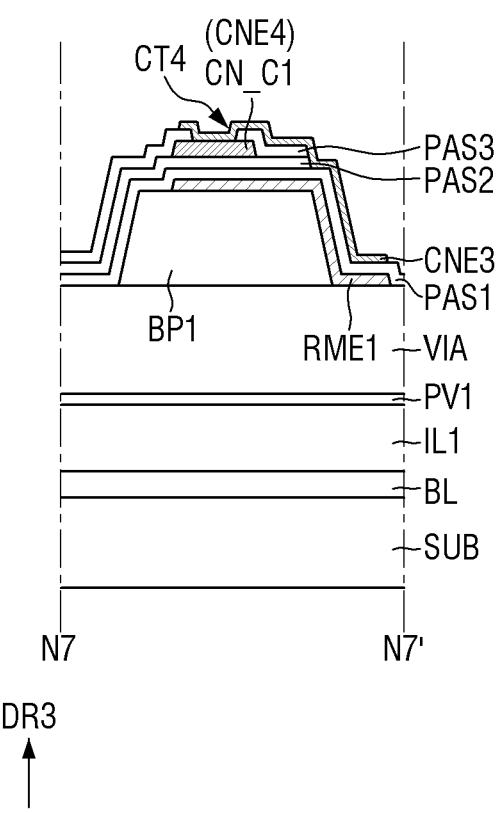
FIG. 20 is a schematic cross-sectional view taken along line N7-N7' of FIG. 15.

FIG. 16 is a schematic plan view of a first connecting electrode layer disposed in the subpixel of FIG. 15. FIG. 17 is a schematic plan view of a second connecting electrode layer disposed in the subpixel of FIG. 15. FIG. 18 is a schematic cross-sectional view taken along line N5-N5' of FIG. 15. FIG. 19 is a schematic cross-sectional view taken along line N6-N6' of FIG. 15. FIG. 20 is a schematic cross-sectional view taken along line N7-N7' of FIG. 15.

FIGS. 16 and 17 illustrate the layout of first through eighth connecting electrodes CNE1 through CNE8, which may be from different connecting electrode layers, in the subpixel SPXn of FIG. 15. FIG. 18 illustrates a cross-sectional view taken across both end portions of each of first and second light-emitting elements ED1 and ED2 in the subpixel SPXn of FIG. 15. FIG. 19 illustrates a cross-sectional view taken across contact holes (CT1 through CT3) in the subpixel SPXn of FIG. 15, and FIG. 20 illustrates a cross-sectional view taken across fourth contact holes CT4 in the subpixel SPXn of FIG. 15.

Referring to FIGS. 16 through 20 and further to FIG. 15, the display device 10_2 may include more electrodes RME, more bank patterns (BP1 through BP3), more light-emitting elements ED, and more connecting electrodes CNE in each subpixel SPXn than the display device 10_1 of FIG. 10. The display device 10_2 may differ from the display device 10_1 of FIG. 10 at least in that larger numbers of electrodes RME and light-emitting elements ED may be provided. The display device 10_2 will hereinafter be described, focusing on the differences with the display device 10_1 of FIG. 10.

The bank patterns (BP1 through BP3) may include first and second bank patterns BP1 and BP2 and may further include a third bank pattern BP3, which may be disposed between the first and second bank patterns BP1 and BP2. The first bank pattern BP1 may be disposed on the left side of the center of an emission area EMA, the second bank pattern BP2 may be disposed on the right side of the center of the emission area EMA, and the third bank pattern BP3 may be disposed in the middle of the emission area EMA. The third bank pattern BP3 may have a larger width than the first and second bank patterns BP1 and BP2 in a second direction DR2. The distance between the bank patterns (BP1 through BP3) may be greater than the distance between the electrodes RME. The first bank pattern BP1 may be disposed to partially overlap a first electrode RME1, and the second bank pattern BP2 may be disposed to partially overlap a fourth electrode RME4. The third bank pattern BP3 may be disposed to partially overlap second and fourth electrodes RME2 and RME3. The electrodes RME may be disposed not to overlap, at least partially, the bank patterns (BP1 through BP3).

The electrodes RME may include the first and second electrodes RME1 and RME2 and may further include the third and fourth electrodes RME3 and RME4.

The third electrode RME3 may be disposed between the first and second electrodes RME1 and RME2, and the fourth electrode RME4 may be spaced apart from the third electrode RME3 in the second direction DR2 with the second electrode RME2 interposed therebetween. The electrodes RME may be arranged in the order of the first, third, second, and fourth electrodes RME1, RME3, RME2, and RME4 along a left-to-right direction. The electrodes RME may be spaced apart from, and face, one another in the second direction DR2. The electrodes RME may be spaced apart from electrodes RME of a neighboring subpixel SPXn, in a first direction DR1, of the subpixel SPXn of FIG. 15, in a separation part ROP of a subarea SA.

The first and second electrodes RME1 and RME2, but not the third and fourth electrodes RME3 and RME4, may be in contact with a first conductive pattern CDP1 and a second voltage line VL2, respectively, through first and second electrode contact holes CTD and CTS, respectively, below the bank layer BNL.

A first insulating layer PAS1 may be arranged in a similar layout to its counterpart of any one of the previous embodiments. The first insulating layer PAS1 may be disposed in an entire display area DPA and may cover the electrodes RME and the bank patterns (BP1 through BP3).

The light-emitting elements ED may be disposed between the bank patterns (BP1 through BP3) or on different electrodes RME. Some of the light-emitting elements ED may be disposed between the first and third bank patterns BP1 and BP3, and other light-emitting elements ED may be disposed between the second and third bank patterns BP2 and BP3. The light-emitting elements ED may include first light-emitting elements ED1 and third light-emitting elements ED3, which may be disposed between the first and third bank patterns BP1 and BP3, and second light-emitting elements ED2 and fourth light-emitting elements ED4, which may be disposed between the second and third bank patterns BP2 and BP3. The first light-emitting elements ED1 and the third light-emitting elements ED3 may be disposed on the first and third electrodes RME1 and RME3, and the second light-emitting elements ED2 and the fourth light-emitting elements ED4 may be disposed on the second and fourth electrodes RME2 and RME4. The first light-emitting elements ED1 and the second light-emitting elements ED2 may be disposed in a lower portion of the emission area EMA, near the subarea SA, and the third light-emitting elements ED3 and the fourth light-emitting elements ED4 may be disposed in an upper portion of the emission area EMA.

The light-emitting elements ED may be classified into different groups not according to their locations in the emission area EMA, but according to which of the connecting electrodes CNE they are each connected to. The light-emitting elements ED may be in contact with different connecting electrodes CNE and may be classified into different groups according to which of the connecting electrodes CNE they are each in contact with.

The connecting electrodes CNE may include first and second connecting electrodes CNE1 and CNE2, which may be disposed on the first and second electrodes RME1 and RME2, and may further include third through eighth connecting electrodes CNE3 through CNE8. Connecting electrode patterns (CNP1 and CNP2) may include first and second connecting electrode patterns CNP1 and CNP2, which may be disposed on the first and fourth electrodes RME1 and RME4, respectively, in the subarea SA.

In the embodiment of FIG. 15, like in the embodiment of FIG. 10, the first and second connecting electrodes CNE1 and CNE2 may be relatively short in the first direction DR1. The first and second connecting electrodes CNE1 and CNE2 may be disposed on the lower side of the center of the emission area EMA. The first connecting electrode CNE1 may be in contact with first end portions of the first light-emitting elements ED1, and the second connecting electrode CNE2 may be in contact with second end portions of the second light-emitting elements ED2.

The first and second connecting electrodes CNE1 and CNE2 may be disposed in and across the emission area EMA and the subarea SA and may be electrically connected to the electrodes RME through first contact holes CT1, second contact holes CT2, and third contact holes CT3, which may be formed in the subarea SA. The first connecting electrode CNE1 may be in direct contact with the first connecting electrode CNP1 through a third contact hole CT3, which penetrates a third insulating layer PAS3, and may be electrically connected to the first electrode RME1. The second connecting electrode CNE2 may be in direct contact with the second RME2 through a second contact hole CT2, which penetrates first and second insulating layers PAS1 and PAS2, in the subarea SA. The first connecting electrode CNE1 may be included in the second connecting electrode layer on the third insulating layer PAS3, and the second connecting electrode CNE2 and the first connecting electrode pattern CNP1 may be included in the first connecting electrode layer between the second and third insulating layers PAS2 and PAS3.

The third connecting electrode CNE3 may be disposed on the first electrode RME1 and may be included in the second connecting electrode layer on the third insulating layer PAS3. The third connecting electrode CNE3 may be spaced apart from the first connecting electrode CNE1 in the first direction DR1 and may face the fifth connecting electrode CNE5. The third connecting electrode CNE3 may be in contact with first end portions of the third light-emitting elements ED3, which may be disposed in the upper portion of the emission area EMA. The third connecting electrode CNE3 may be disposed in the emission area EMA and may be shorter than the first connecting electrode CNE1 in the first direction DR1. The third connecting electrode CNE3 may not be directly connected to the first or second electrode RME1 or RME2.

The fourth connecting electrode CNE4 may be included in the first connecting electrode layer between the second and third insulating layers PAS2 and PAS3. The fourth connecting electrode CNE4 may include a first extension portion CN_E1, which may be disposed in the emission area EMA, a first connecting portion CN_C1, which may be in contact with the third connecting electrode CNE3, and first through third bypass portions CN_B1 through CN_B3, which connect the first extension portion CN_E1 and the first connecting portion CN_C1.

The first extension portion CN_E1 may be disposed on the third electrode RME3 to be spaced apart from the fifth connecting electrode CNE5 in the first direction DR1 and face the first connecting electrode CNE1 in the second direction DR2. The first extension portion CN_E1 may be in contact with second end portions of the first light-emitting elements ED1, which may be disposed in the lower portion of the emission area EMA. The first extension portion CN_E1 may be disposed in and across the emission area EMA and the subarea SA.

As the fourth connecting electrode CNE4 includes the first through third bypass portions CN_B1 through CN_B3 and the first connecting portion CN_C1, the first extension CN_E1 of the fourth connecting electrode CNE4 may be electrically connected to the third connecting electrode CNE3. The fourth connecting electrode CNE4 may include the first through third bypass portions CN_B1 through CN_B3, which connect the first extension portion CN_E1 and the first connecting portion CN_C1.

In the embodiment of FIG. 15, like in the embodiment of FIG. 10, the first bypass portion CN_B1 may be disposed in the subarea SA, which may be disposed on the lower side of the emission area EMA, to extend in the second direction DR2 to the bank layer BNL. The second bypass portion CN_B2 may extend in the first direction DR1 over the bank layer BNL. The third bypass portion CN_B3 may extend in the second direction DR2 over the bank layer BNL. The third bypass portion CN_B3 may be connected to the second bypass portion CN_B2 to partially overlap the first electrode RME1 and may extend to be spaced apart from the fifth connecting electrode CNE5. The first connecting portion CN_C1 may be connected to the third bypass portion CN_B3 and may extend in the first direction DR1. The first connecting portion CN_C1 may be long enough to overlap the third connecting electrode CNE3, from s portion of the bank layer BNL on the upper side of the emission area EMA. The first connecting portion CN_C1 may be directly connected to the third connecting electrode CNE3 through a fourth contact hole CT4, which penetrates the third insulating layer PAS3. The first contact holes CT1, the second contact holes CT2, and the third contact holes CT3 may be disposed in the subarea SA, but the fourth contact holes CT4 may be disposed in the emission area EMA.

The first extension portion CN_E1, the first through third bypass portions CN_B1 through CN_B3, and the first connecting portion CN_C1 of the fourth connecting electrode CNE4 may be integrally formed into a single pattern. The fourth connecting electrode CNE4 may include the first extension portion CN_E1, the first through third bypass portions CN_B1 through CN_B3, which bypass the emission area EMA and the first connecting electrode CNE1, and the first connecting portion CN_C1, which may be directly connected to the third connecting electrode CNE3. The fourth connecting electrode CNE4 may not be directly connected to the electrodes RME, but may be electrically connected to the third connecting electrode CNE3.

The fifth connecting electrode CNE5 may be included in the first connecting electrode layer between the second and third insulating layers PAS2 and PAS3. The fifth connecting electrode CNE5 may include a second extension portion CN_E2, which may be disposed in the emission area EMA, a second connecting portion CN_C2, which may be in contact with the sixth connecting electrode CNE6, and a fourth bypass portion CN_B4, which connects the second extension portion CN_E2 and the second connecting portion CN_C2.

The second extension CN_E2 may be disposed on the third electrode RME3 to be spaced apart from the first extension CN_E1 of the fourth connecting electrode CNE4 in the first direction DR1 and may face the third connecting electrode CNE3 in the second direction DR2. The second extension CN_E2 may be in contact with second end portions of the third light-emitting elements ED3, which may be disposed in the upper portion of the emission area EMA. The second extension CN_E2 may be disposed in and across the emission area EMA and the portion of the bank layer BNL on the upper side of the emission area EMA.

As the fifth connecting electrode CNE5 includes the fourth bypass portion CN_B4 and the second connecting portion CN_C2, the second extension CN_E2 may be electrically connected to the sixth connecting electrode CNE6. The fourth bypass portion CN_B4 of the fifth connecting electrode CNE5 may extend in the second direction DR2 over the bank layer BNL. The fourth bypass portion CN_B4 may be connected to the second extension portion CN_E2 to partially overlap the second and fourth electrodes RME2 and RME4. The second connecting portion CN_C2 may be connected to the fourth bypass portion CN_B4 and may extend in the first direction DR1. The second connecting portion CN_C2 may be long enough to overlap the sixth connecting electrode CNE6, from the portion of the bank layer BNL on the upper side of the emission area EMA. The second connecting portion CN_C2 may be directly connected to the sixth connecting electrode CNE6 through a fourth contact hole CT4, which penetrates the third insulating layer PAS3.

The second extension portion CN_E2, the fourth bypass portion CN_B4, and the second connecting portion CN_C2 of the fifth connecting electrode CNE5 may be integrally formed into a single pattern. The fifth connecting electrode CNE5 may include the second connecting portion CN_E2, the fourth bypass portion CN_B4, which bypasses the seventh connecting electrode CNE7, and the second connecting portion CN_C2, which may be directly connected to the sixth connecting electrode CNE6. The fifth connecting electrode CNE5 may not be directly connected to the electrodes RME, but may be electrically connected to the sixth connecting electrode CNE6.

The sixth connecting electrode CNE6 may be disposed on the fourth electrode RME4 and may be included in the second connecting electrode layer on the third insulating layer PAS3. The sixth connecting electrode CNE6 may be spaced apart from the eighth connecting electrode CNE8 in the first direction DR1 and may face the seventh connecting electrode CNE7. The sixth connecting electrode CNE6 may be in contact with first end portions of the fourth light-emitting elements ED4, which may be disposed in the upper portion of the emission area EMA. The sixth connecting electrode CNE6 may be disposed in the emission area EMA and may be shorter than the first connecting electrode CNE1 in the first direction DR1. The sixth connecting electrode CNE6 may not be directly connected to the first or second electrode RME1 or RME2.

The seventh connecting electrode CNE7 may be included in the first connecting electrode layer between the second and third insulating layers PAS2 and PAS3. The seventh connecting electrode CNE7 may include a third extension CN_E3, which may be disposed in the emission area EMA, a third connecting portion CN_C3, which may be in contact with the eighth connecting electrode CNE8, and a fifth bypass portion CN_B5, which connects the third extension CN_E3 and the third connecting portion CN_C3.

The third extension CN_E3 may be disposed on the second electrode RME2 to be spaced apart from the second connecting electrode CNE2 in the first direction DR1 and may face the sixth connecting electrode CNE6 in the second direction DR2. The third extension CN_E3 may be in contact with second end portions of the fourth light-emitting elements ED4, which may be disposed in the upper portion of the emission area EMA. The third extension portion CN_E3 may be disposed in the emission area EMA.

As the seventh connecting electrode CNE7 includes the fifth bypass portion CN_B5 and the third connecting portion CN_C3, the third extension CN_E3 may be electrically connected to the eight connecting electrode CNE8. The fifth bypass portion CN_B5 of the seventh connecting electrode CNE7 may be disposed between the second connecting electrode CNE2 and the third extension CN_E3 and between the sixth and eighth connecting electrodes CNE6 and CNE8, in the emission area EMA, to extend in the second direction DR2. The fifth bypass portion CN_B5 may be connected to the third extension portion CN_E3 to partially overlap the second and fourth electrodes RME2 and RME4. The third connecting portion CN_C3 may be connected to the fifth bypass portion CN_B5 and may extend in the first direction DR1. The third connecting portion CN_C3 may be long enough to overlap the eighth connecting electrode CNE8, in the middle of the emission area EMA. The third connecting portion CN_C3 may be directly connected to the eighth connecting electrode CNE8 through a fourth contact hole CT4, which penetrates the third insulating layer PAS3.

The third extension portion CN_E3, the fifth bypass portion CN_B5, and the third connecting portion CN_C3 of the seventh connecting electrode CNE7 may be integrally formed into a single pattern. The seventh connecting electrode CNE7 may not be directly connected to the electrodes RME, but may be electrically connected to the eighth connecting electrode CNE8.

The eighth connecting electrode CNE8 may be disposed on the fourth electrode RME4 and may be included in the second connecting electrode layer on the third insulating layer PAS3. The eighth connecting electrode CNE8 may be spaced apart from the sixth connecting electrode CNE6 in the first direction DR1 and may face the second connecting electrode CNE2. The eighth connecting electrode CNE8 may be in contact with first end portions of the second light-emitting elements ED2, which may be disposed in the lower portion of the emission area EMA. The eighth connecting electrode CNE8 may be disposed in and across the emission area EMA and the subarea SA and may have the same length as the first connecting electrode CNE1 in the first direction DR1. The eighth connecting electrode CNE8 may be in direct contact with the second connecting electrode pattern CNP2 through a third contact hole CT3, which penetrates the third insulating layer PAS3, and may be electrically connected to the first electrode RME1.

The first and second connecting electrode patterns CNP1 and CNP2 may be disposed in the subarea SA, which may be on the lower side of the emission area EMA. The first connecting electrode pattern CNP1 may be disposed to overlap the first electrode RME1 and may be in direct contact with the first electrode RME1. The second connecting electrode pattern CNP2 may be disposed to overlap the fourth electrode RME4 and may be in contact with the fourth electrode RME4. The first and second connecting electrode patterns CNP1 and CNP2 may be directly connected to the first and fourth electrodes RME1 and RME4, respectively, through different first contact holes CT1, which penetrate the first and second insulating layers PAS1 and PAS2.

The first, third, sixth, and eighth connecting electrodes CNE1, CNE3, CNE6, and CNE8 may be included in the second connecting electrode layer on the third insulating layer PAS3, and the second, fourth, fifth, and seventh connecting electrodes CNE2, CNE4, CNE5, and CNE7 may be included in the first connecting electrode layer between the second and third insulating layers PAS2 and PAS3. The first, second, fourth, and eighth connecting electrodes CNE1, CNE2, CNE4, and CNE8 may be first-type connecting electrodes that may be either in direct contact with the electrodes RME or electrically connected to the electrodes RME by being in direct contact with the first or second connecting electrode pattern CNP1 or CNP2. The third, fifth, sixth, and seventh connecting electrodes CNE3, CNE5, CNE6, and CNE7 may be second-type connecting electrodes that may not be in direct contact with the electrodes RME. The second-type connecting electrodes may not be directly connected to the electrodes RME and may form electrical connecting circuits by being in contact with the light-emitting elements ED. The third, sixth, and eighth connecting electrodes CNE3, CNE6, and CNE8 may be portions of the second connecting electrode layer that may be in direct contact with the first connecting electrode layer.

The second, fourth, fifth, and seventh connecting electrodes CNE2, CNE4, CNE5, and CNE7 of the first connecting electrode layer may include an opaque conductive material, and the first, third, sixth, and eighth connecting electrodes CNE1, CNE3, CNE6, and CNE8 of the second connecting electrode layer may include a transparent conductive material. In the embodiment of FIG. 15, like in the embodiment of FIG. 4, the second, fourth, fifth, and seventh connecting electrodes CNE2, CNE4, CNE5, and CNE7 may be thicker than the first, third, sixth, and eighth connecting electrodes CNE1, CNE3, CNE6, and CNE8. The first, third, sixth, and eighth connecting electrodes CNE1, CNE3, CNE6, and CNE8 may include the same material, for example, at least one of ITO, IZO, and ITZO. The second, fourth, fifth, and seventh connecting electrodes CNE2, CNE4, CNE5, and CNE7 and the first and second connecting electrode patterns CNP1 and CNP2 may include the same material, for example, a metal such as Ag, Cu, or Al, an alloy including Al, Ni, or La, an alloy including a metal such as Ti, Mo, Nb, or a stack of a layer of such metal or a layer of such alloy.

The light-emitting elements ED may be classified into different groups according to which of the connecting electrodes CNE they are each in contact with. The first end portions of the first light-emitting elements ED1 may be in contact with the first connecting electrode CNE1, and the second end portions of the first light-emitting elements ED1 may be in contact with the fourth connecting electrode CNE4. The first end portions of the second light-emitting elements ED2 may be in contact with the eighth connecting electrode CNE8, and the second end portions of the second light-emitting elements ED2 may be in contact with the second connecting electrode CNE2. The first end portions of the third light-emitting elements ED3 may be in contact with the third connecting electrode CNE3, and the second end portions of the third light-emitting elements ED3 may be in contact with the fifth connecting electrode CNE5. The first end portions of the fourth light-emitting elements ED4 may be in contact with the sixth connecting electrode CNE6, and the second end portions of the fourth light-emitting elements ED4 may be in contact with the seventh connecting electrode CNE7. The first end portions of the first light-emitting elements ED1 may be electrically connected to the first electrode RME1, and the second end portions of the second light-emitting elements ED2 may be electrically connected to the second electrode RME2. The second end portions of the first light-emitting elements ED1, the first end portions of the third light-emitting elements ED3, the first end portions of the fourth light-emitting elements ED4, and the first end portions of the second end portions ED2 may be electrically connected to one another through the third through eighth connecting electrodes CNE3 through CNE8.

The light-emitting elements ED may be connected in series to one another through the connecting electrodes CNE. As the display device 10_2 includes a relatively large number of light-emitting elements ED in each subpixel SPXn and can configure serial connections between the light-emitting elements ED, the amount of light emitted per unit area can be further increased.

Figure 21:
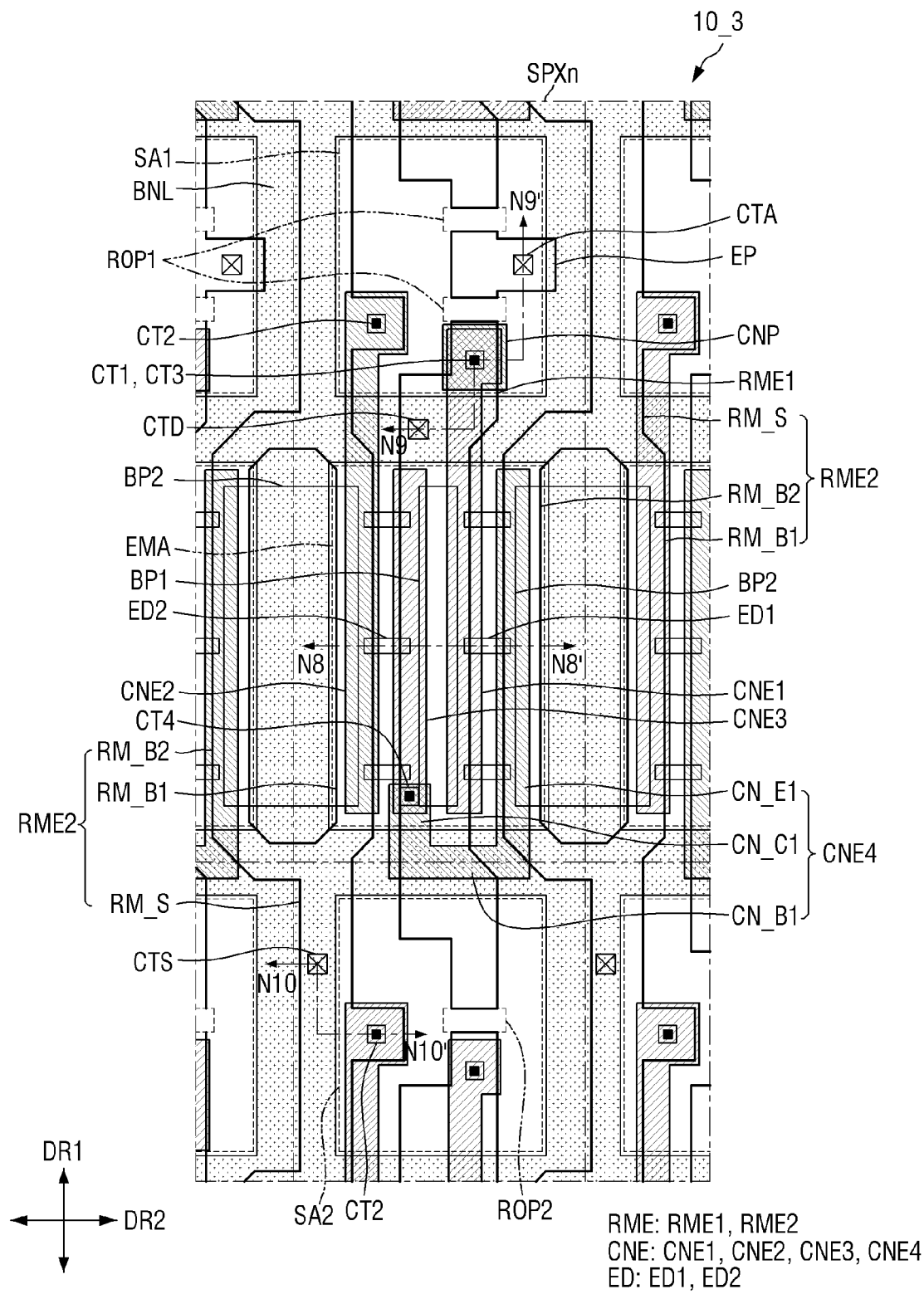
FIG. 21 is a schematic plan view of a subpixel of a display device according to another embodiment of the disclosure.
Figure 22:
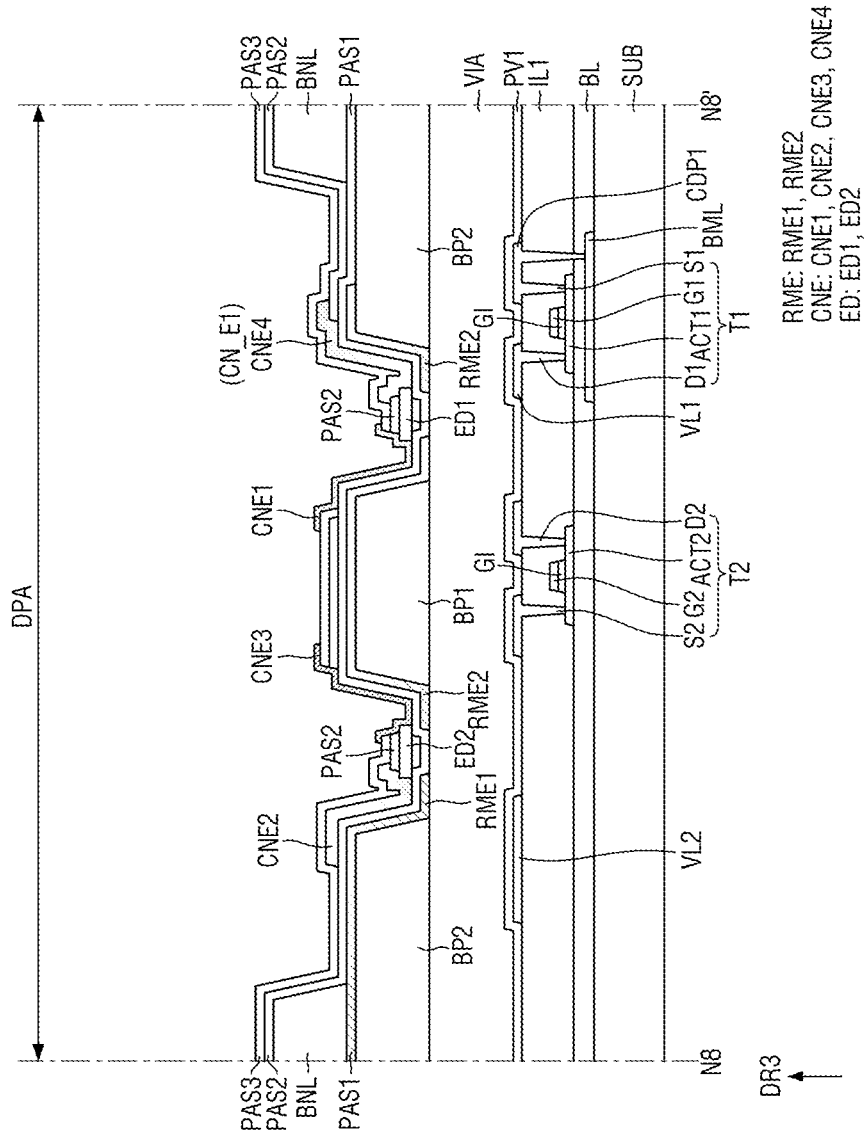
FIG. 22 is a schematic cross-sectional view taken along line N8-N8' of FIG. 21.
Figure 23:
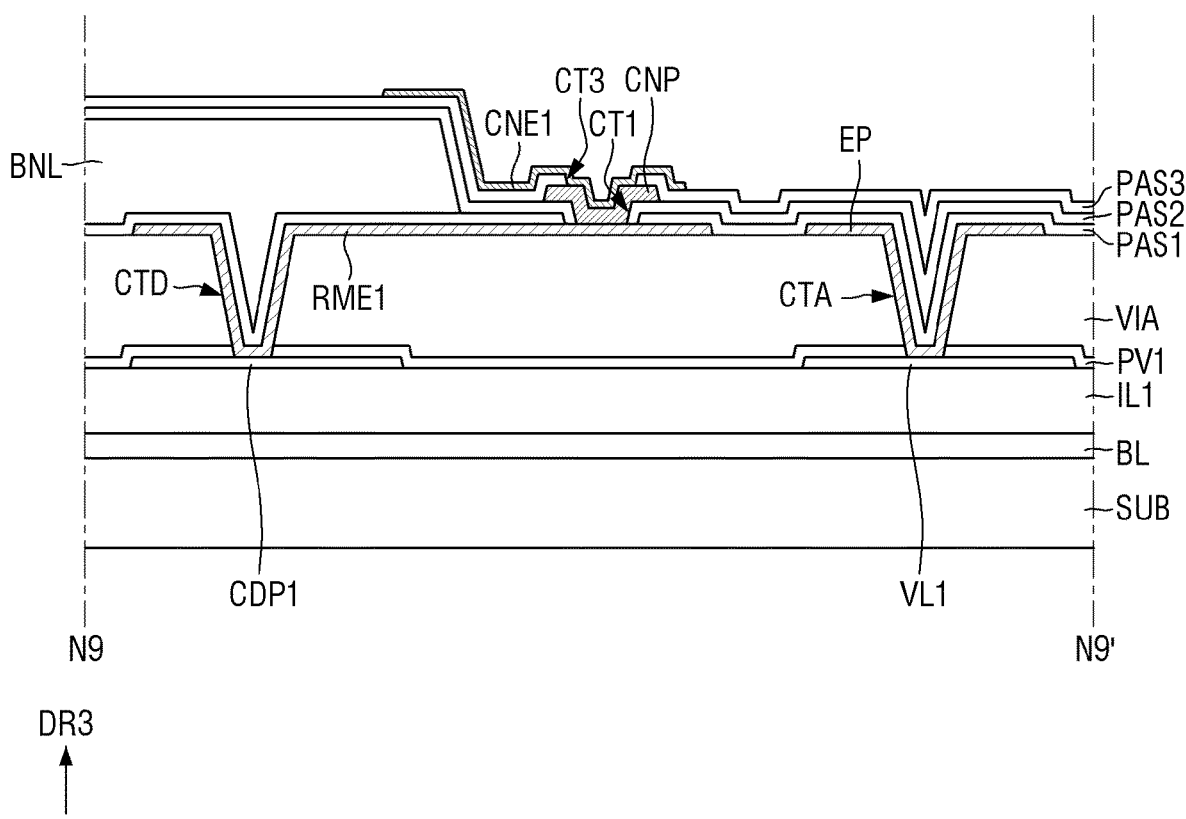
FIG. 23 is a schematic cross-sectional view taken along line N9-N9' of FIG. 21.
Figure 24:
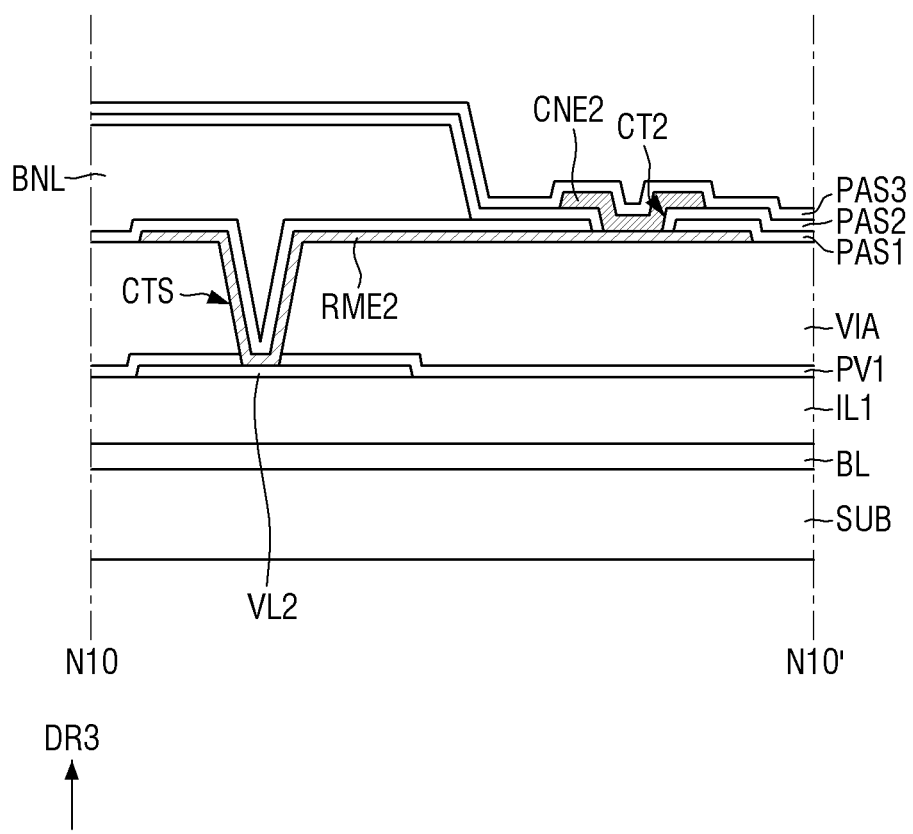
FIG. 24 is a schematic cross-sectional view taken along line N10-N10' of FIG. 21.

FIG. 21 is a schematic plan view of a subpixel of a display device according to another embodiment of the disclosure. FIG. 22 is a schematic cross-sectional view taken along line N8-N8' of FIG. 21. FIG. 23 is a schematic cross-sectional view taken along line N9-N9' of FIG. 21. FIG. 24 is a schematic cross-sectional view taken along line N10-N10' of FIG. 21.

FIG. 21 illustrates the layout of electrodes RME, bank patterns (BP1 and BP2), a bank layer BNL, light-emitting elements ED, and connecting electrodes CNE in a pixel PX of a display device 10_3. FIG. 22 illustrates a cross-sectional view taken across both end portions of each of light-emitting elements ED on different electrodes RME. FIGS. 23 and 24 illustrate cross-sectional views taken across electrode contact holes (CTD, CTS, and CTA) and contact holes (CT1 through CT4).

The embodiment of FIGS. 21 through 24 may differ from the previous embodiments at least in the structures of the electrodes RME, the connecting electrodes CNE, and the bank patterns (BP1 and BP2). The embodiment of FIGS. 21 through 24 will hereinafter be described, focusing on the differences with the previous embodiments.

Referring to FIGS. 21 through 24, the bank patterns (BP1 and BP2) may extend in a first direction DR1 and may have different widths in a second direction DR2, and one of the bank patterns (BP1 and BP2) may be disposed in a pair of adjacent subpixels SPXn in the second direction DR2. For example, the bank patterns (BP1 and BP2) may include a first bank pattern BP1 and second bank patterns BP2, which may be disposed over emission areas EMA of two different subpixels SPXn.

The first bank pattern BP1 may be disposed in the middle of an emission area EMA of a subpixel SPXn of FIG. 21, and the second bank patterns BP2 may be spaced apart from each other with the first bank pattern BP1 interposed therebetween. The first bank pattern BP1 and the second bank patterns BP2 may be alternately arranged in the second direction DR2. Light-emitting elements ED may be disposed between the first bank pattern BP1 and the second bank patterns BP2.

The first bank pattern BP1 and the second bank patterns BP2 may have the same length in the first direction DR1 and may have different widths in the second direction DR2. Portions of the bank layer BNL that extend in the first direction DR1 may overlap the second bank patterns BP2 in a thickness direction. The first bank pattern BP1 may be disposed to overlap a first electrode RME1, and the second bank patterns BP2 may be disposed to overlap electrode branches (RM_B1 and RM_B2) of second electrodes RME2 and the bank layer BNL.

The first bank pattern BP1 and the second bank patterns BP2 may have the same length in the first direction DR1 and may have different widths in the second direction DR2. Portions of the bank layer BNL that extend in the first direction DR1 may overlap the second bank patterns BP2 in the thickness direction. The bank patterns (BP1 and BP2) may be arranged as island patterns over the entire surface of a display area DPA.

The electrodes RME may include a first electrode RME1, which may be disposed in the middle of the subpixel SPXn, and second electrodes RME2, which may be disposed not only in the subpixel SPXn, but also in other subpixels SPXn. The first electrode RME1 and the second electrodes RME2 may generally extend in a first direction DR1 and may have different shapes in an emission area EMA.

The first electrode RME1 may be disposed in the middle of the subpixel SPXn, and portion of the first electrode RME1 in an emission area EMA may be disposed on a first bank pattern BP1. The first electrode RME1 may extend in the first direction DR1 from a first subarea SA1 of the subpixel SPXn to a second subarea SA2 of another subpixel SPXn. The width, in a second direction DR2, of the first electrode RME1 may vary, and at least a portion of the first electrode RME1 that overlaps the first bank pattern BP1, in the emission area EMA, may have a larger width than the first bank pattern BP1.

The second electrodes RME2 may include parts that extend in the first direction DR1 and parts that branch off near the emission areas EMA. For example, the second electrodes RME2 may include electrode stems RM_S, which extend in the first direction DR1, and electrode branches (RM_B1 and RM_B2), which branch off of the electrode stems RM_S to be bent in the second direction DR2 and extend back in the first direction DR1. The electrode stems RM_S may be disposed on sides, in the second direction DR2, of the first subarea SA1 to overlap portions of the bank layer BNL that extend in the first direction DR1. The electrode branches (RM_B1 and RM_B2) may branch off of the electrode stems RM_S, which may be disposed not only on the portions of the bank layer BNL that extend in the first direction DR1, but also on portions of the bank layer BNL that extend in the second direction DR2, and may be bent from both sides, in the second direction DR2, of their respective electrode stems RM_S. The electrode branches (RM_B1 and RM_B2) may be arranged along the first direction DR1 over two different emission areas EMA and may be bent to be incorporated into, and connected to, the electrode stems RM_S. For example, the electrode branches (RM_B1 and RM_B2) may branch off of the electrode stems RM_S, above the emission area EMA, and may be connected together, below the emission area EMA.

The electrode branches (RM_B1 and RM_B2) may include first and second electrode branches RM_B1 and RM_B2, which may be disposed on the left and right sides, respectively, of the first electrode RME1. Sets of first and second electrode branches RM_B1 and RM_B2 of a second electrode RME2 may be disposed in the emission areas EMA of multiple subpixels SPXn that may be adjacent to one another in the second direction DR2, and first and second electrode branches RM_B1 and RM_B2 from two different second electrodes RME2 may be disposed in a subpixel SPXn. The first electrode branch RM_B1 of the subpixel SPXn of FIG. 21 may be disposed on the left side of the first electrode RME1, and the second electrode branch RM_B2 of the subpixel SPXn of FIG. 21 may be disposed on the right side of the first electrode RME1.

The electrode branches (RM_B1 and RM_B2) may overlap sides of second bank patterns BP2. The first electrode branch RM_B1 may partially overlap a second bank pattern BP2 on the left side of the first bank pattern BP1, and the second electrode branch RM_B2 may partially overlap a second bank pattern BP2 on the right side of the first bank pattern BP1. The first electrode RME1 may be spaced apart from, and face, two different electrode branches (RM_B1 and RM_B2) of two different electrodes RME2, and the distance between the first electrode RME1 and the electrode branches (RM_B1 and RM_B2) may be less than the distance between the bank patterns (BP1 and BP2).

The width, in the first direction DR2, of the first electrode RME1 may be greater than the widths of the electrode stem RM_S and the electrode branches (RM_B1 and RM_B2). The first electrode RME1 may have a greater width than the first bank pattern BP1 and cover both side surfaces of the first bank pattern BP1. On the contrary, the second electrodes RME2 may be formed to have a relatively small width, and thus, the electrode branches (RM_B1 and RM_B2) may overlap only one side surface of their respective second bank patterns BP2.

The first electrode RME1 may be in contact with a first conductive pattern CDP1 of a third conductive layer through a first electrode contact hole CTD, in an area that overlaps the portion of the bank layer BNL that extends in the second direction DR2. The electrode stem RM_S may be in contact with a second voltage line VL2 of the third conductive layer through a second electrode contact hole CTS. Portion of the first electrode RME1 that may be disposed in the first subarea SA1 may overlap a first contact hole CT1. Each of the second electrodes RME2 may include protruding parts that protrude in the second direction DR2 from the electrode stem RM_S to be disposed in different subareas SA, and each of the protruding portions of each of the second electrodes RME2 may overlap a second contact hole CT2.

The first electrode RME1 may be disconnected in the first subarea SA1 by first separation parts ROP1 and in a second subarea SA2 by a separation part ROP2, but the second electrodes RME2 may not be disconnected in the subareas SA1 and SA2. Each of the second electrodes RME2 may include electrode stems RM_S and sets of electrode branches (RM_B1 and RM_B2) and may extend in the first direction DR1, and the second electrodes RME2 may branch off near the emission area EMA of each subpixel SPXn. The first electrode RME1 may be disposed between separation parts ROP of two different subareas SA, i.e., between one of the first separation parts ROP1 of the first subarea SA1 and the second separation part ROP2 of the second subarea SA2, across the emission area EMA of the subpixel SPXn of FIG. 21.

The display area 10 may further include, in the subpixel SPXn of FIG. 21, a wiring connecting electrode EP, which may be disposed in the first subarea SA1, between the first electrode RME1 and a first electrode RME1 of another subpixel SPXn. No wiring connecting electrode EP may be disposed in the second subarea SA, and the first electrode RME1 of the subpixel SPXn may be spaced apart from a first electrode RME1 of a lower neighboring subpixel SPXn, in the first direction DR1, of the subpixel SPXn. In the subpixel SPXn of FIG. 21, the first subarea SA1 where the wiring connecting electrode EP may be disposed may be arranged on the upper side of the emission area EMA, and the second subarea SA2 may be disposed on the lower side of the emission area EMA. On the contrary, in the lower neighboring subpixel SPXn of the subpixel SPXn of FIG. 21, the first subarea SA1 where the wiring connecting electrode EP may be disposed may be arranged on the lower side of the emission area EMA, and the second subarea SA2 may be disposed on the upper side of the emission area EMA.

The first electrode RME1 may be spaced apart from the wiring connecting electrode EP by one of the first separation parts ROP1 in the first subarea SA1. Two first separation parts ROP1 may be provided in the first subarea SA1, and the wiring connecting electrode EP may be spaced apart from the first electrode RME1 by the lower first separation part ROP1, and may be spaced apart from a first electrode RME1 of an upper neighboring subpixel SPXn, in the first direction DR1, of the subpixel SPXn of FIG. 21 by the upper first separation part ROP1. Only one second separation part ROP2 may be provided in the second subarea SA2, and different first electrodes RME1 may be spaced apart from one another in the first direction DR1.

The wiring connecting electrode EP may be connected to a first voltage line VL1 of the third conductive layer through a third electrode contact hole CTA, which penetrates a via layer VIA and a first passivation layer PV1. The first electrode RME1 may be formed to be connected to the wiring connecting electrode EP, and an electrical signal for arranging light-emitting elements ED may be applied from the first voltage line VL1 to the first electrode RME1 through the wiring connecting electrode EP. The arrangement of the light-emitting elements ED may be performed by applying signals to the first and second voltage lines VL1 and VL2, and the signals may be transmitted to the first electrode RME1 and the second electrodes RME2.

The second and third electrode contact holes CTS and CTA may have different layouts. The second electrode contact hole CTS may be disposed in a portion of the bank layer BNL that surround the second subarea SA, and the third electrode contact hole CTA may be disposed in the first subarea SA1. The locations of the second and third electrode contact holes CTS and CTA may be determined in consideration that the second and third electrode contact holes CTS and CTA expose the top surfaces of different voltage lines.

The bank layer BNL may surround the emission area EMA and the first and second areas SA1 and SA2. In an embodiment where two separate subareas, i.e., the first and second subareas SA1 and SA2, may be provided, areas surrounded by the bank layer BNL may be distinguished from one another. The bank layer BNL may be the same as its counterpart of any one of the previous embodiments, except that it surrounds different subareas, i.e., the first and second subareas SA1 and SA2.

The light-emitting elements ED may be disposed on different electrodes RME, between different bank patterns (BP1 and BP2). The light-emitting elements ED may include first light-emitting elements ED1, which may be disposed between the first electrode RME1 and the second electrode branch RM_B2 of one of the second electrode RME2, and second light-emitting elements ED2, which may be disposed on the first electrode RME1 and the first electrode branch RM_B1 of another second electrode RME2. The first light-emitting elements ED1 may be disposed on the right side of the first electrode RME1, and the second light-emitting elements ED2 may be disposed on the left side of the first electrode RME1. The first light-emitting elements ED1 may be disposed on the first electrode RME1 and one of the second electrodes RME2, and the second light-emitting elements ED2 may be disposed on the first electrode RME1 and another second electrode RME2.

The connecting electrodes CNE may include first through fourth connecting electrodes CNE1 through CNE4.

The first connecting electrode CNE1 may extend in the first direction DR1 and may be disposed on the first electrode RME1. The first connecting electrode CNE1 may be included in a second connecting electrode layer on a third insulating layer PAS3. A portion of the first connecting electrode CNE1 on the first bank pattern BP1 may overlap the first electrode RME1, and the first connecting electrode CNE1 may extend in the first direction DR1 from its part overlapping the first electrode RME1, beyond the bank layer BNL, and may thus be disposed even in the first subarea SA1, which may be disposed on the upper side of the emission area EMA. The first connecting electrode CNE1 may be in contact with first ends of the first light-emitting elements ED1. The first connecting electrode CNE1 may be in contact with a connecting electrode pattern CNP in the first subarea SA1, which may be disposed on the upper side of the emission area EMA, through a third contact hole CT3, which penetrates the third insulating layer PAS3, and may be electrically connected to the first electrode RME1.

The second connecting electrode CNE2 may extend in the first direction DR2 and may be disposed on one of the second electrodes RME2, i.e., on the left second electrode RME2. The second connecting electrode CNE2 may be included in a first connecting electrode layer between a second insulating layer PAS2 and the third insulating layer PAS3. A portion of the second connecting electrode CNE2 on the left second bank pattern BP2 may overlap the left second electrode RME2, and the second connecting electrode CNE2 may extend in the first direction DR1 from its part overlapping the left second electrode RME2, beyond the bank layer BNL, and may thus be disposed even in the first subarea SA1, which may be disposed on the upper side of the emission area EMA. The second connecting electrode CNE2 may be in contact with second end portions of the second light-emitting elements ED2. The second connecting electrode CNE2 may be in contact with the left second electrode RME2 through the second contact hole CT2, which penetrates the second and third insulating layers PAS2 and PAS3, in the first subarea SA1.

The connecting electrode pattern CNP may be disposed in the first subarea SA1, which may be disposed on the upper side of the emission area EMA. The connecting electrode pattern CNP may be disposed to overlap the first electrode RME1 and may be in direct contact with the first electrode RME1. The connecting electrode pattern CNP may be directly connected to the first electrode RME1 through the first contact hole CT1, which penetrates the first and second insulating layers PAS1 and PAS2.

The third connecting electrode CNE3 may be disposed on the first electrode RME1, in the emission area EMA, and may face the second connecting electrode CNE2. The third connecting electrode CNE3 may be included in the second connecting electrode layer on the third insulating layer PAS3. The third connecting electrode CNE3 may be in contact with first end portions of the second light-emitting elements ED2. The third connecting electrode CNE3 may be shorter than the first connecting electrode CNE1 in the first direction DR1. The third connecting electrode CNE3 may not be directly connected to the first or second electrode RME1 or RME2.

The fourth connecting electrode CNE4 may be included in the first connecting electrode layer between the second and third insulating layers PAS2 and PAS3. The fourth connecting electrode CNE4 may include a first extension portion CN_E1, which may be disposed in the emission area EMA, a first connecting portion CN_C1, which may be in contact with the third connecting electrode CNE3, and a first bypass portion CN_B1, which connects the first extension portion CN_E1 and the first connecting portion CN_C1.

The first extension CN_E1 of the fourth connecting electrode CNE4 may face the first connecting electrode CNE1, in the emission area EMA, and may be disposed on a second electrode branch RM_B2 of a second electrode RME2. The first extension portion CN_E1 may be in contact with second end portions of the first light-emitting elements ED1.

The first bypass portion CN_B1 of the fourth connecting electrode CNE4 may extend in the second direction DR2, over a portion of the bank layer BNL on the lower side of the emission area EMA, to connect the first extension portion CN_E1 and the first connecting portion CN_C1. The first connecting portion CN_C1 may be connected to the first bypass portion CN_B1 and may extend in the first direction DR1. The first connecting portion CN_C1 may be long enough to overlap the third connecting electrode CNE3, from the portion of the bank layer BNL on the lower side of the emission area EMA. The first connecting portion CN_C1 may be directly connected to the third connecting electrode CNE3 through a fourth contact hole CT4, which penetrates the third insulating layer PAS3. The first through third contact holes CT1 through CT3 may be disposed in the first or second emission area SA1 or SA2, but the fourth contact hole CT4 may be disposed in the emission area EMA.

The first extension portion CN_E1, the first bypass portion CN_B1, and the first connecting portion CN_C1 of the fourth connecting electrode CNE4 may be integrally formed into a single pattern. The fourth connecting electrode CNE4 may include the first extension portion CN_E1, which may be in direct contact with the light-emitting elements ED, the first bypass portion CN_B1, which bypasses the emission area EMA and the first connecting electrode CNE1, over the bank layer BNL, and the first connecting portion CN_C1, which may be directly connected to the third connecting electrode CNE3. The fourth connecting electrode CNE4 may not be directly connected to the electrodes RME, but may be electrically connected to the third connecting electrode CNE3.

The display device 10_3 may include electrodes RME and bank patterns (BP1 and BP2) having different structures from the display device 10, 10_1, or 10_2. The light-emitting elements ED may be classified into the first light-emitting elements ED1 and the second light-emitting elements ED2 according to their locations and which of the connecting electrodes CNE the light-emitting elements ED are each in contact with. The light-emitting elements ED may be electrically connected in series to one another.

In concluding the detailed description, those skilled in the art will appreciate that many variations and modifications can be made to the embodiments without substantially departing from the principles of the disclosure. Therefore, the disclosed embodiments are used in a generic and descriptive sense only and not for purposes of limitation.

What is claimed is:

1. A display device comprising:
a first electrode extending in a first direction;
a second electrode spaced apart from the first electrode in a second direction, the second electrode extending in the first direction;
light-emitting elements disposed on the first and second electrodes, the light-emitting elements having first end portions disposed on the first electrode, and second end portions disposed on the second electrode;
a first connecting electrode extending in the first direction and disposed on the first electrode, the first connecting electrode being in electrical contact with the first end portions of the light-emitting elements;
a second connecting electrode extending in the first direction and disposed on the second electrode, the second connecting electrode being in electrical contact with the second end portions of the light-emitting elements; and
a connecting electrode pattern disposed on the first electrode, the connecting electrode pattern overlapping the first connecting electrode in a plan view, wherein
the second connecting electrode and the connecting electrode pattern include a same material, and
a thickness of the first connecting electrode is less than a thickness of the second connecting electrode and a thickness of the connecting electrode pattern.

2. The display device of claim 1, wherein
the first connecting electrode includes at least one of indium tin oxide, indium zinc oxide, indium gallium oxide, indium zinc tin oxide, indium gallium tin oxide, indium gallium zinc oxide, and indium gallium zinc tin oxide, and
each of the second connecting electrode and the connecting electrode pattern include at least one of silver, copper, aluminum, nickel, lanthanum, titanium, molybdenum, niobium, and an alloy thereof.

3. The display device of claim 2, wherein
the thickness of the first connecting electrode is in a range of about 500 Å to about 1000 Å, and
the thickness of the second connecting electrode and the thickness of the connecting electrode pattern is in a range of about 1000 Å to about 3000 Å.

4. The display device of claim 2, wherein
each of the light-emitting elements includes:
a first semiconductor layer;
a second semiconductor layer; and
a light-emitting layer disposed between the first and second semiconductor layers,
the second semiconductor layers of the light-emitting elements are disposed in the first end portions of the light-emitting elements, and
the first semiconductor layers of the light-emitting elements are disposed in the second end portions of the light-emitting elements and are in electrical contact with the second connecting electrode.

5. The display device of claim 1, further comprising:
a first insulating layer disposed on the first and second electrodes;
a second insulating layer disposed on the light-emitting elements, on the first insulating layer; and
a third insulating layer disposed on the second insulating layer, the second connecting electrode, and the connecting electrode pattern, wherein
the light-emitting elements are disposed directly on the first insulating layer, and
a portion of the first connecting electrode is disposed directly on the third insulating layer.

6. The display device of claim 5, wherein
the connecting electrode pattern is in direct contact with the first electrode through a first contact hole which penetrates the first and second insulating layers,
the second connecting electrode is in direct contact with the second electrode through a second contact hole which penetrates the first and second insulating layers, and
the first connecting electrode is in direct contact with the connecting electrode pattern through a third contact hole which penetrates the third insulating layer.

7. The display device of claim 5, further comprising:
a bank layer disposed on the first insulating layer, the bank layer surrounding an emission area where the light-emitting elements are disposed and a subarea which is disposed on a side of the emission area, wherein
the first and second electrodes are disposed in and across the emission area and the subarea, and
the connecting electrode pattern is disposed in the subarea.

8. The display device of claim 1, further comprising:
another second electrode, the second electrode and the another second electrode being spaced apart from the first electrode with the first electrode disposed between the second electrode and the another second electrode, wherein
the light-emitting elements include:
first light-emitting elements which have first end portions disposed on the first electrode and second end portions disposed on the second electrode; and
second light-emitting elements which have first end portions disposed on the first electrode and second end portions disposed on the another second electrode.

9. The display device of claim 8, wherein
the first connecting electrode is disposed on the first electrode and is in electrical contact with the first end portions of the first light-emitting elements, and
the second connecting electrode is disposed on the another second electrode where the second end portions of the second light-emitting elements are disposed, and is in electrical contact with the second end portions of the second light-emitting elements.

10. The display device of claim 9, further comprising:
a third connecting electrode spaced apart from the first connecting electrode and disposed on the first electrode, the third connecting electrode being in electrical contact with the first end portions of the second light-emitting elements; and
a fourth connecting electrode in electrical contact with the second end portions of the second light-emitting elements and the third connecting electrode,
wherein the fourth connecting electrode includes:
a first extension portion which is disposed on the another second electrode where the second end portions of the second light-emitting elements are disposed;

a first connecting portion which is in electrical contact with the third connecting electrode; and
a first bypass portion which is connected to the first extension portion and the first connecting portion and bypasses the first connecting electrode.

11. A display device comprising:
a first electrode extending in a first direction;
a second electrode spaced apart from the first electrode in a second direction, the second electrode extending in the first direction;
light-emitting elements disposed on the first and second electrodes, the light-emitting elements having first end portions disposed on the first electrode and second end portions disposed on the second electrode;
a first connecting electrode extending in the first direction and disposed on the first electrode;
a second connecting electrode extending in the first direction and disposed on the second electrode;
a third connecting electrode spaced apart from the first connecting electrode in the first direction and disposed on the first electrode, the third connecting electrode facing the second connecting electrode in the second direction;
a fourth connecting electrode including a first extension portion which faces the first connecting electrode in the second direction; and
a connecting electrode pattern disposed on the first electrode, the connecting electrode pattern overlapping the first connecting electrode in a plan view,
wherein the fourth connecting electrode further includes:
a first connecting portion which is disposed on the first electrode and is in electrical contact with the third connecting electrode, and
one or more bypass portions which are electrically connected to the first extension portion and the first connecting portion and bypass the first connecting electrode.

12. The display device of claim 11, wherein
the first and third connecting electrodes include at least one of indium tin oxide, indium zinc oxide, indium gallium oxide, indium zinc tin oxide, indium gallium tin oxide, indium gallium zinc oxide, and indium gallium zinc tin oxide,
the second and fourth connecting electrodes and the connecting electrode pattern include at least one of silver, copper, aluminum, nickel, lanthanum, titanium, molybdenum, niobium, and an alloy thereof, and
a thickness of the first and third connecting electrodes is less than a thickness of the second and fourth connecting electrodes and a thickness of the connecting electrode pattern.

13. The display device of claim 12, wherein
the first extension portion of the fourth connecting electrode is spaced apart from the second connecting electrode in the first direction and is disposed on the second electrode, and
the light-emitting elements include:
first light-emitting elements which have first end portions in electrical contact with the first connecting electrode and second end portions in electrical contact with the first extension portion of the fourth connecting electrode; and
second light-emitting elements which have first end portions in electrical contact with the third connecting electrode and second end portions in electrical contact with the second connecting electrode.

14. The display device of claim 11, further comprising:
a first insulating layer disposed on the first and second electrodes; and
a bank layer disposed on the first insulating layer, the bank layer surrounding an emission area where the light-emitting elements are disposed and a subarea which is disposed on one side of the emission area,
wherein the one or more bypass portions of the fourth connecting electrode include:
a first bypass portion which extends in the second direction in the subarea;
a second bypass portion which is electrically connected to the first bypass portion and extends in the first direction on the bank layer; and
a third bypass portion which is electrically connected to the second bypass portion and the first connecting portion and extends in the second direction and is spaced apart from the second connecting electrode.

15. The display device of claim 14, further comprising:
a second insulating layer disposed on the light-emitting elements and the first insulating layer; and
a third insulating layer disposed on the second insulating layer, the second and fourth connecting electrodes, and the connecting electrode pattern, wherein
the light-emitting elements are disposed directly on the first insulating layer, and
portions of the first and third connecting electrodes are disposed directly on the third insulating layer.

16. The display device of claim 15, wherein
the connecting electrode pattern is in direct contact with the first electrode through a first contact hole which penetrates the first and second insulating layers,
the second connecting electrode is in direct contact with the second electrode through a second contact hole which penetrates the first and second insulating layers,
the first connecting electrode is in direct contact with the connecting electrode pattern through a third contact hole which penetrates the third insulating layer, and
the third connecting electrode is in direct contact with the fourth connecting electrode through a fourth contact hole which penetrates the third insulating layer, in the emission area.

17. The display device of claim 14, further comprising:
a third electrode extending in the first direction between the first and second electrodes; and
a fourth electrode spaced apart from the third electrode in the second direction with the second electrode interposed therebetween, wherein
the first extension portion of the fourth connecting electrode is disposed between the first and second connecting electrodes and on the third electrode, and
the light-emitting elements include:
first light-emitting elements which have first end portions disposed on the first electrode and in electrical contact with the second connecting electrode;
second light-emitting elements which include second end portions disposed on the second electrode and in electrical contact with the second connecting electrode;
third light-emitting elements which have first end portions disposed on the first electrode and in electrical contact with the third connecting electrode; and
fourth light-emitting elements which have first end portions disposed on the fourth electrode and second end portions disposed on the second electrode.

18. The display device of claim 17, further comprising:
a fifth connecting electrode including a second extension portion which is disposed on the third electrode and electrically contacting second end portions of the third light-emitting elements;
a sixth connecting electrode disposed on the fourth electrode and electrically contacting the first end portions of the fourth light-emitting elements;
a seventh connecting electrode including a third extension portion which is disposed on the second electrode and electrically contacting with the second end portions of the fourth light-emitting elements; and
an eighth connecting electrode disposed on the fourth electrode and electrically contacting first end portions of the second light-emitting elements.

19. The display device of claim 18, wherein
the sixth and eighth connecting electrodes and the first connecting electrode include a same material, and
the fifth and seventh connecting electrodes and the second connecting electrode include a same material.

20. The display device of claim 18, wherein
the fifth connecting electrode further includes:
a fourth bypass portion which is electrically connected to the second extension portion and extends in the second direction on the bank layer; and
a second connecting portion which extends in the first direction from the fourth bypass portion and contacting the sixth connecting electrode, and
the seventh connecting electrode further includes:
a fifth bypass portion which is electrically connected to the third extension portion and extends in the second direction between the second light-emitting elements and the fourth light-emitting elements; and
a third connecting portion which extends in the first direction from the fifth bypass portion and is electrically connected to the eighth connecting electrode.

* * * * *